US011217690B2

(12) United States Patent
Mirchandani et al.

(10) Patent No.: US 11,217,690 B2
(45) Date of Patent: Jan. 4, 2022

(54) TRENCH FIELD ELECTRODE TERMINATION STRUCTURE FOR TRANSISTOR DEVICES

(71) Applicant: Infineon Technologies Austria AG, Villach (AT)

(72) Inventors: Ashita Mirchandani, Torrance, CA (US); Robert Haase, San Pedro, CA (US); Tim Henson, Mount Shasta, CA (US); Ling Ma, Redondo Beach, CA (US); Niraj Ranjan, El Segundo, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/571,712

(22) Filed: Sep. 16, 2019

(65) Prior Publication Data

US 2021/0083096 A1    Mar. 18, 2021

(51) Int. Cl.
*H01L 29/78*    (2006.01)
*H01L 21/02*    (2006.01)
*H01L 21/311*   (2006.01)
*H01L 21/3213*  (2006.01)
*H01L 29/06*    (2006.01)
(Continued)

(52) U.S. Cl.
CPC .... *H01L 29/7811* (2013.01); *H01L 21/02236* (2013.01); *H01L 21/02274* (2013.01); *H01L 21/31144* (2013.01); *H01L 21/32139* (2013.01); *H01L 29/0696* (2013.01); *H01L 29/0865* (2013.01); *H01L 29/1095* (2013.01); *H01L 29/401* (2013.01); *H01L 29/404* (2013.01); *H01L 29/407* (2013.01); *H01L 29/4236* (2013.01); *H01L 29/66734* (2013.01); *H01L 29/7813* (2013.01)

(58) Field of Classification Search
None
See application file for complete search history.

(56) References Cited

U.S. PATENT DOCUMENTS

2002/0036319 A1    3/2002  Baliga
2009/0079002 A1*   3/2009  Lee .................. H01L 29/66712
                                                        257/355

(Continued)

FOREIGN PATENT DOCUMENTS

DE     102015200809 A1    7/2016

*Primary Examiner* — Feifei Yeung Lopez
(74) *Attorney, Agent, or Firm* — Murphy, Bilak & Homiller, PLLC

(57) ABSTRACT

A semiconductor device includes: a trench formed in a surface of a semiconductor substrate and extending lengthwise in a direction parallel to the surface; a body region adjoining the trench; a source region adjoining the trench above the body region; a drift region adjoining the trench below the body region; a field electrode in a lower part of the trench and separated from the substrate; and a gate electrode in an upper part of the trench and separated from the substrate and the field electrode. A first section of the field electrode is buried below the gate electrode in the trench. A second section of the field electrode transitions upward from the first section in a direction toward the surface. The separation between the second section and the gate electrode is greater than or equal to the separation between the first section and the gate electrode.

16 Claims, 36 Drawing Sheets

(51) Int. Cl.
- *H01L 29/08* (2006.01)
- *H01L 29/10* (2006.01)
- *H01L 29/40* (2006.01)
- *H01L 29/423* (2006.01)
- *H01L 29/66* (2006.01)

(56) References Cited

U.S. PATENT DOCUMENTS

| | | |
|---|---|---|
| 2009/0090967 A1 | 4/2009 | Chen et al. |
| 2010/0019314 A1 | 1/2010 | Kachi |
| 2010/0123188 A1 | 5/2010 | Venkatraman |
| 2012/0153386 A1 | 6/2012 | Hirler et al. |
| 2013/0168761 A1 | 7/2013 | Hsieh |
| 2013/0328122 A1 | 12/2013 | Li et al. |
| 2014/0027813 A1 | 1/2014 | Kuruc et al. |
| 2014/0097863 A1 | 4/2014 | Zundel et al. |
| 2016/0064546 A1 | 3/2016 | Zitouni et al. |
| 2016/0104773 A1 | 4/2016 | Kelkar et al. |
| 2016/0329423 A1* | 11/2016 | Kawahara ......... H01L 29/66734 |
| 2017/0170274 A1 | 6/2017 | Wutte et al. |
| 2018/0114857 A1 | 4/2018 | Okada et al. |
| 2018/0226481 A1 | 8/2018 | Wutte et al. |
| 2018/0277637 A1* | 9/2018 | Meiser ............... H01L 29/0623 |
| 2019/0198660 A1 | 6/2019 | Kachi |
| 2019/0280117 A1 | 9/2019 | Mirchandani et al. |
| 2020/0212218 A1 | 7/2020 | Kim et al. |

* cited by examiner

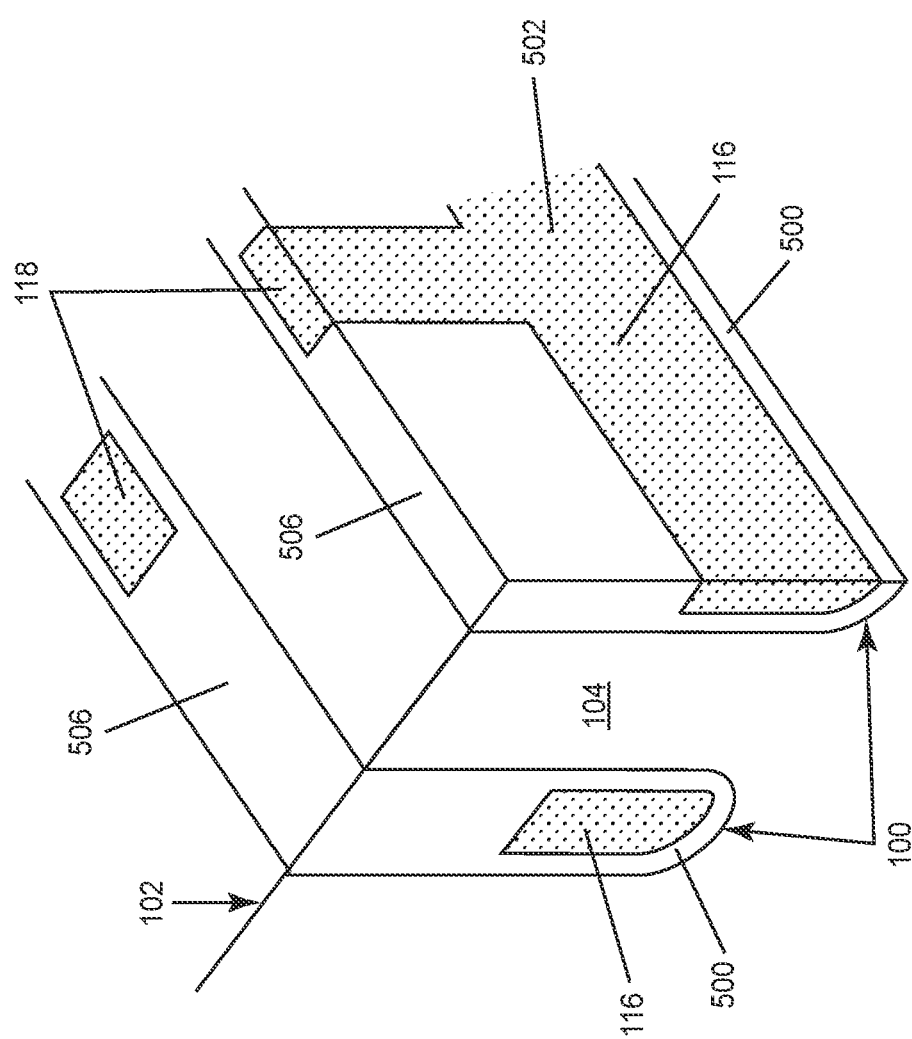

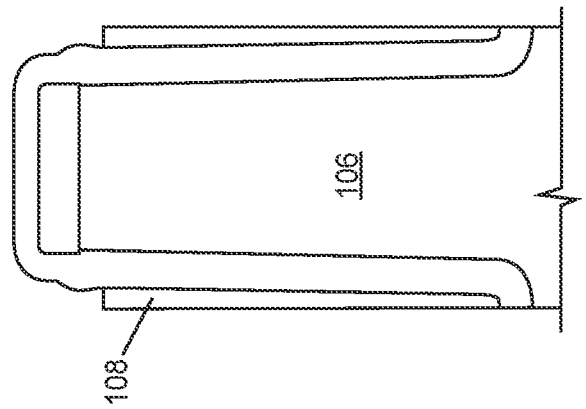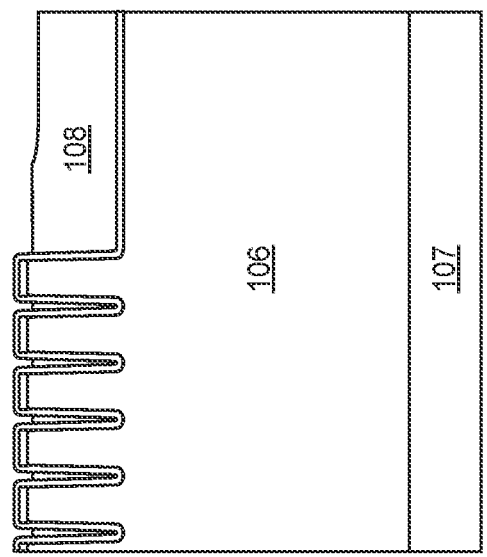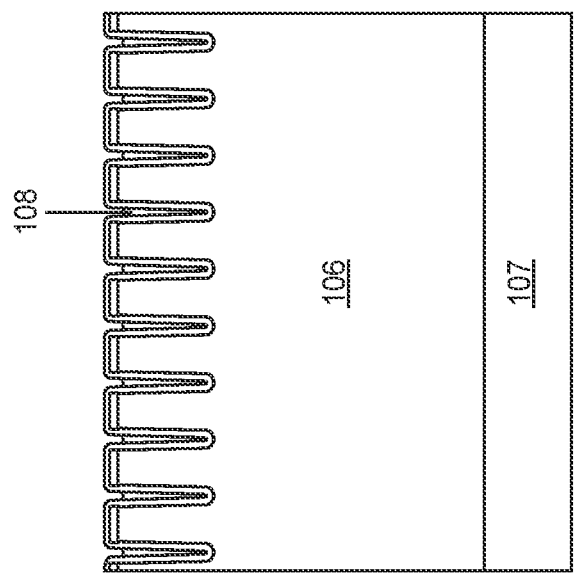
Figure 7D

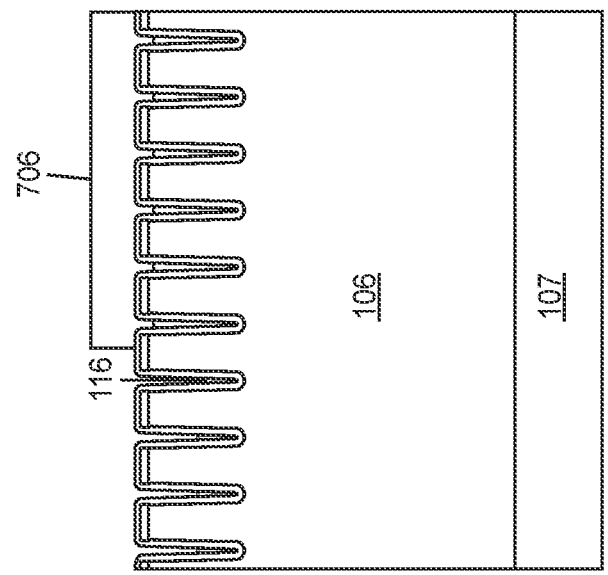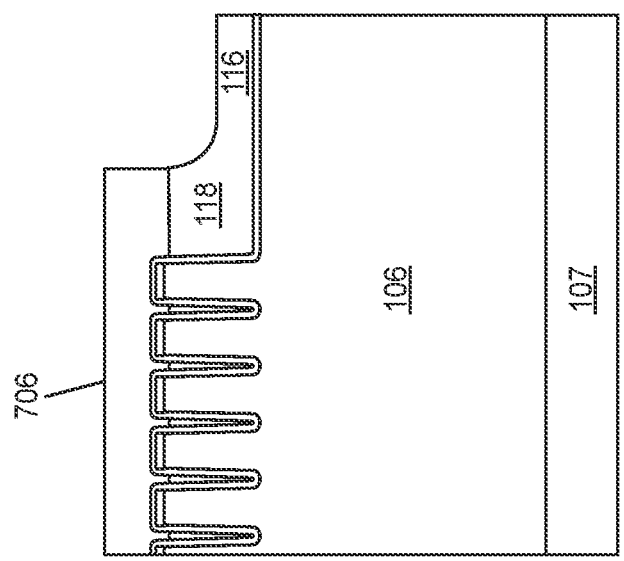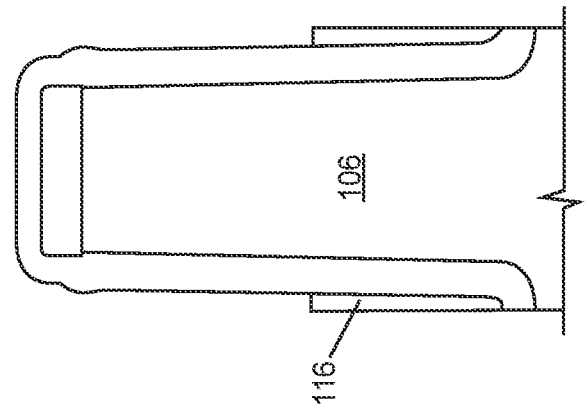
Figure 7E

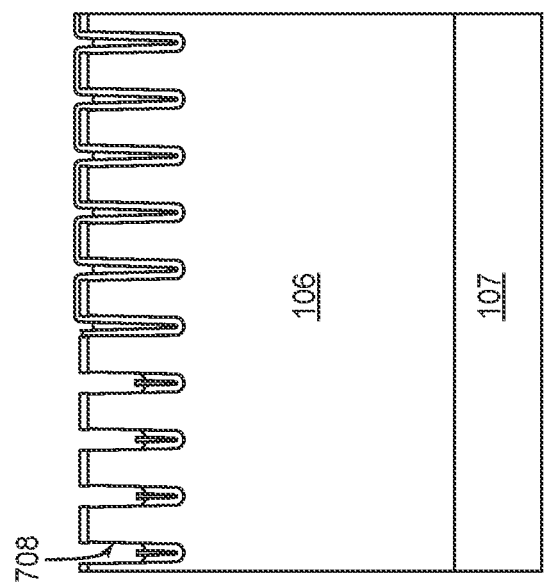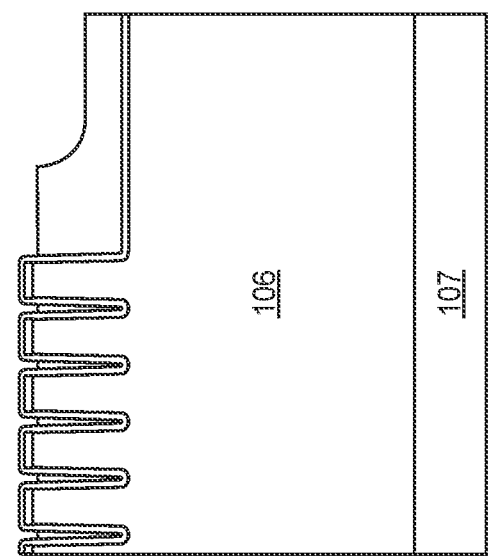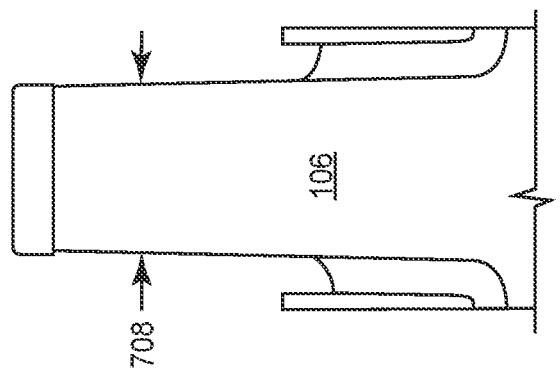
Figure 7F

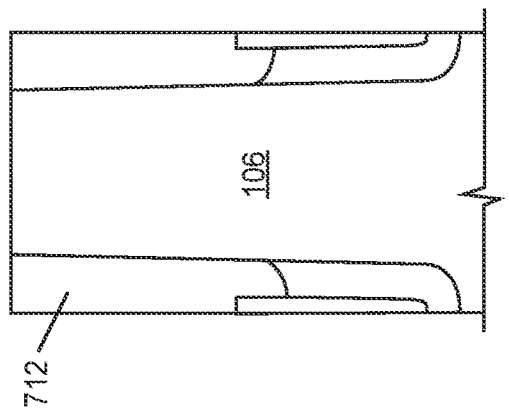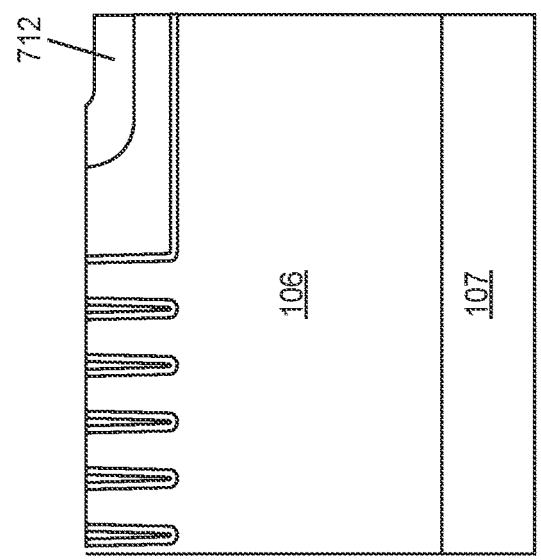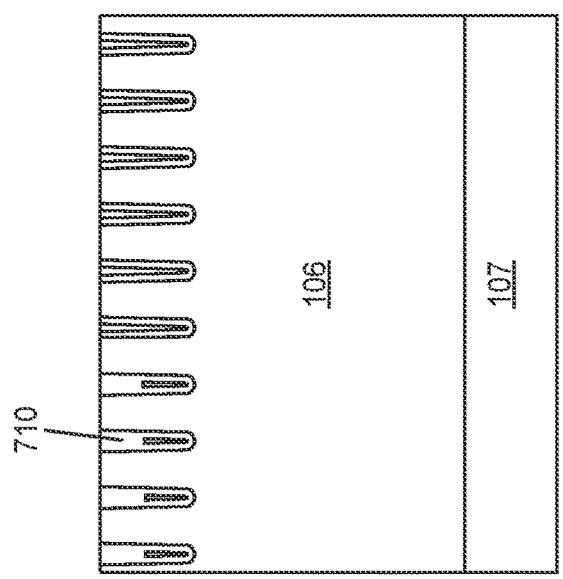
Figure 7H

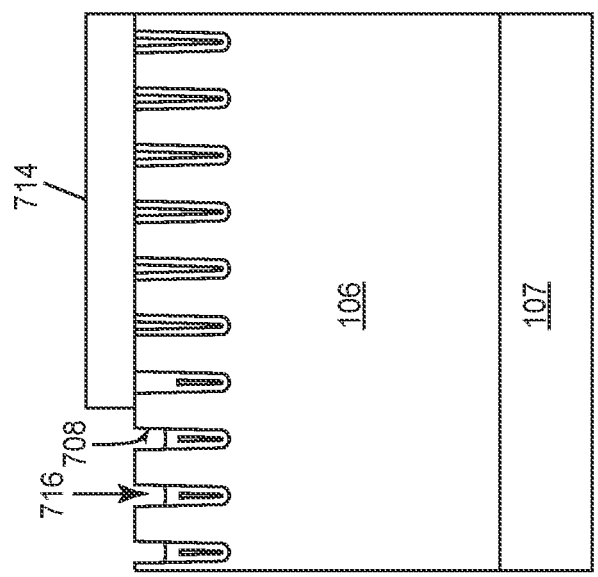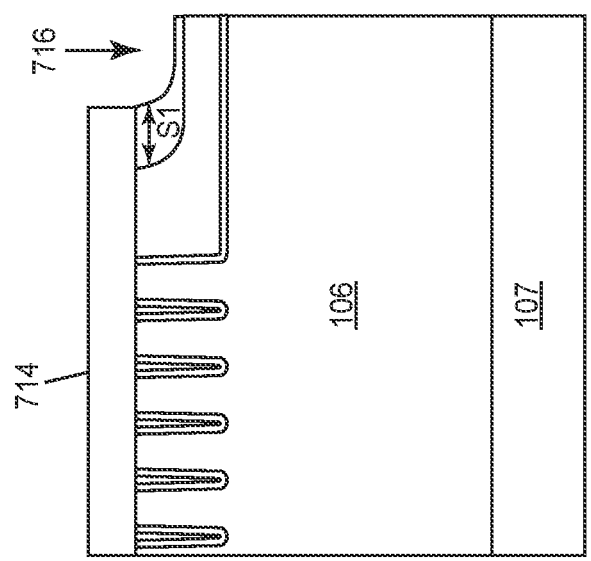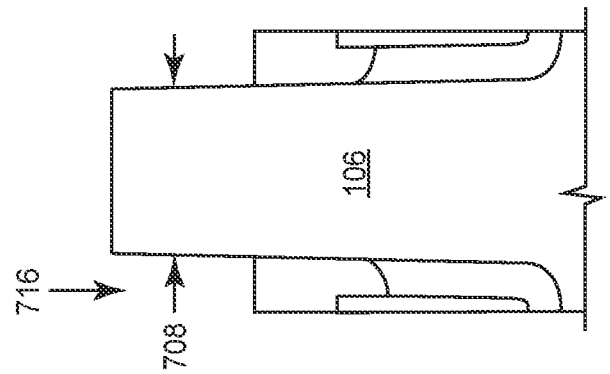
Figure 7I

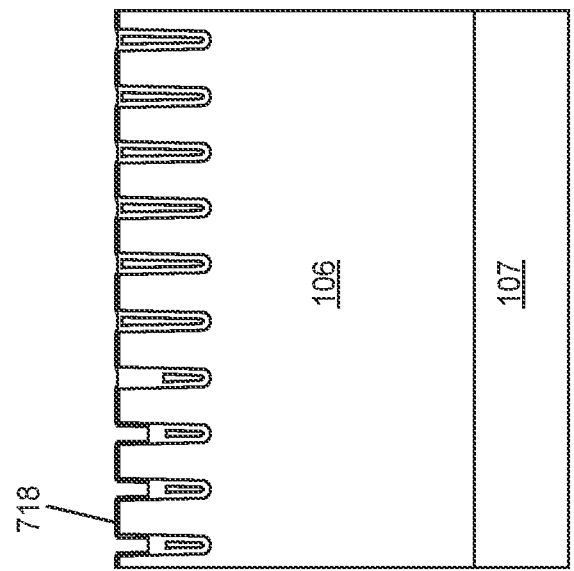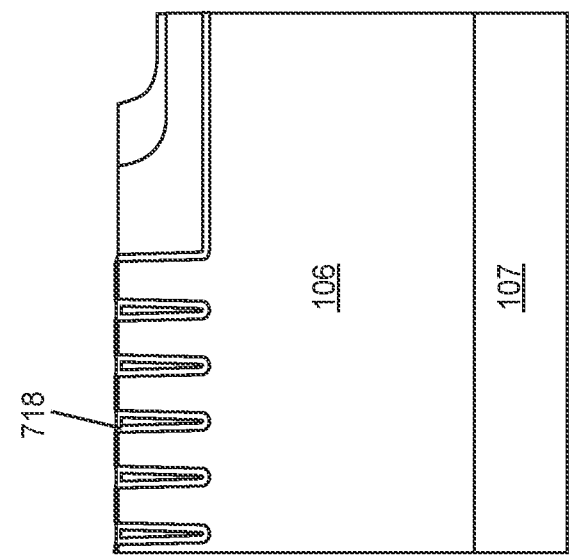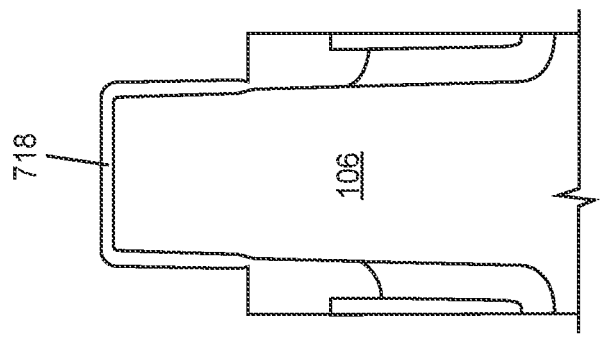
Figure 7J

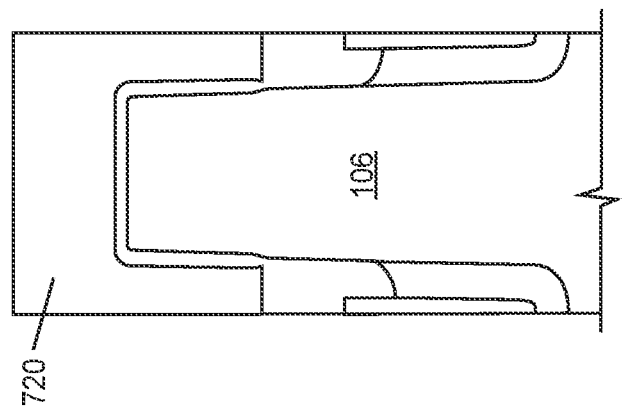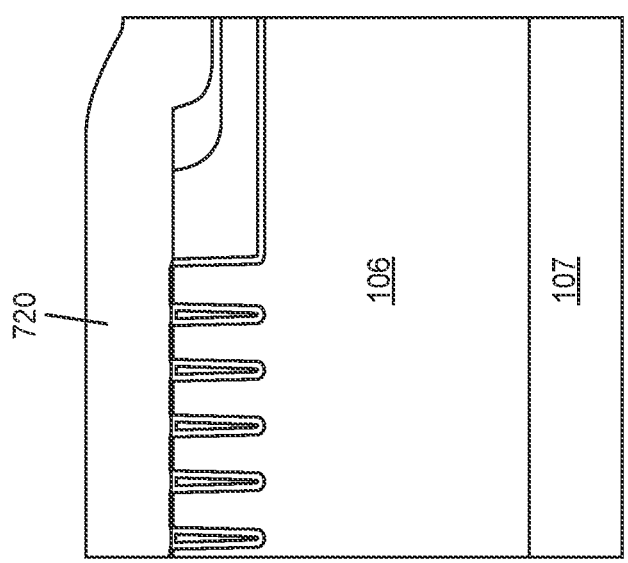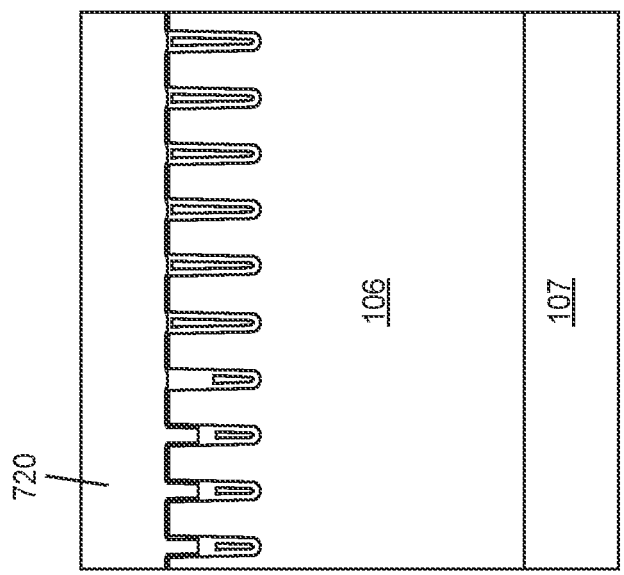
Figure 7K

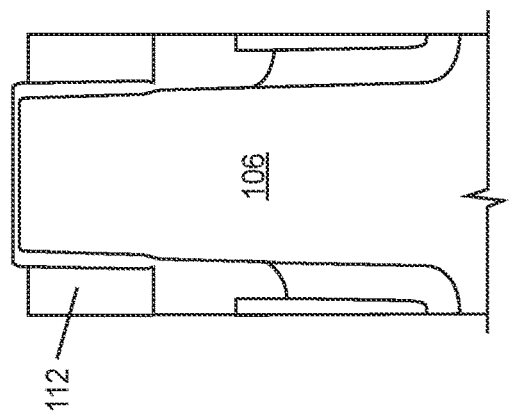
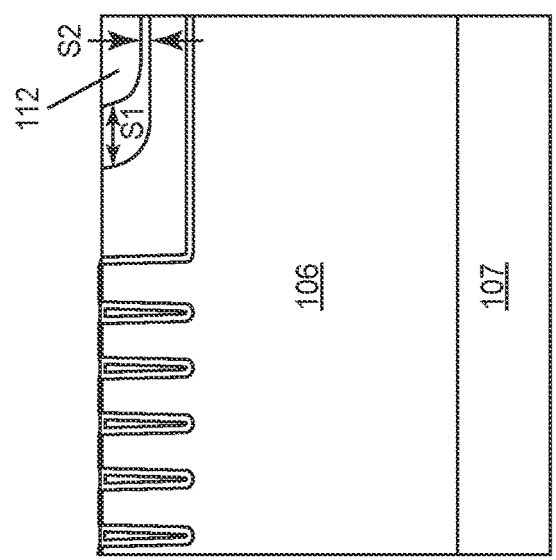
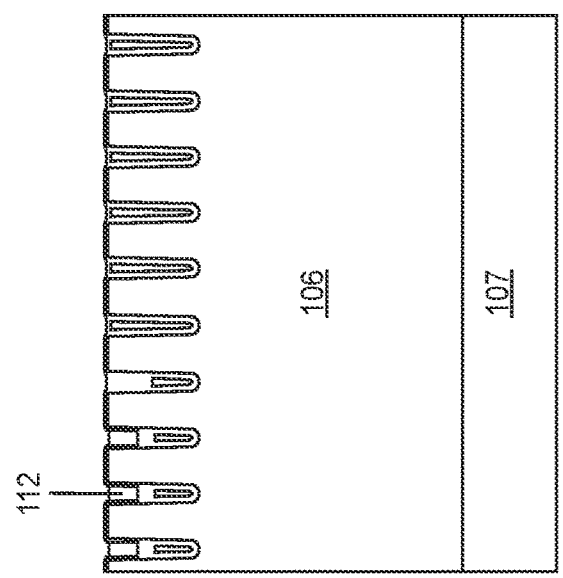
Figure 7L

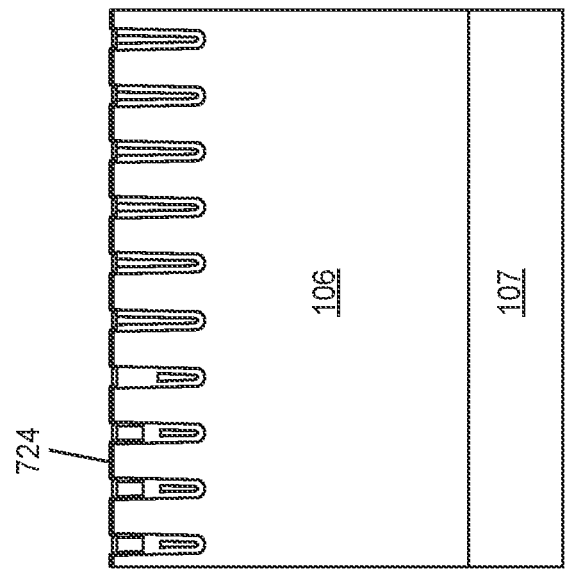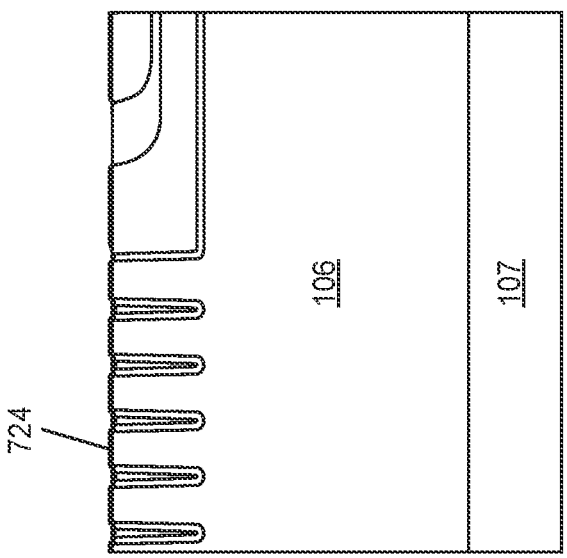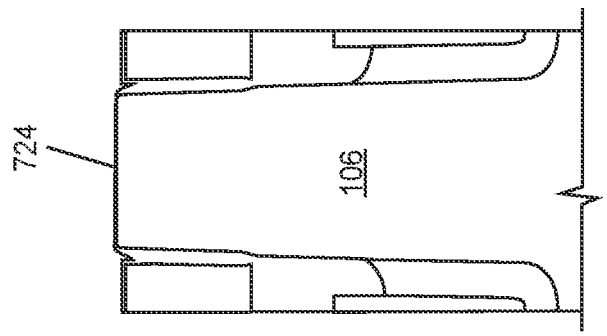
Figure 7N

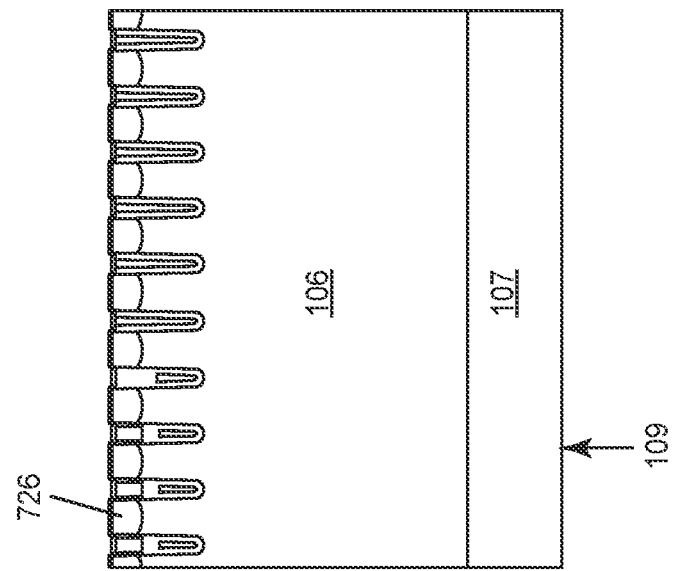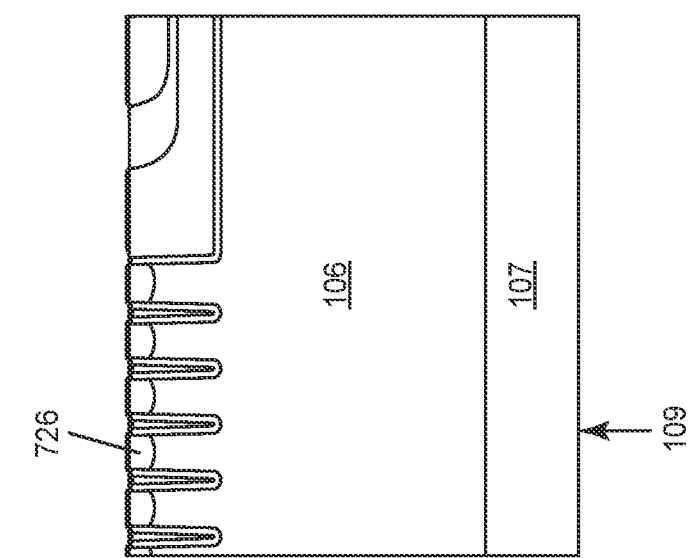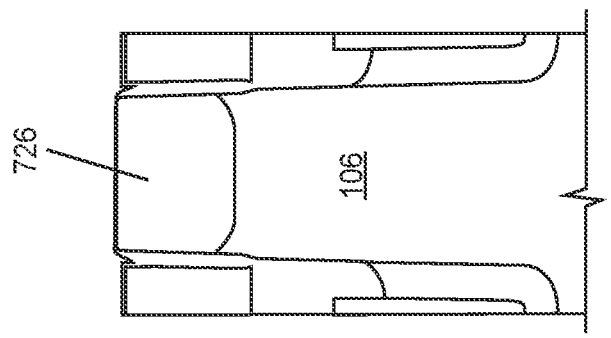
Figure 70

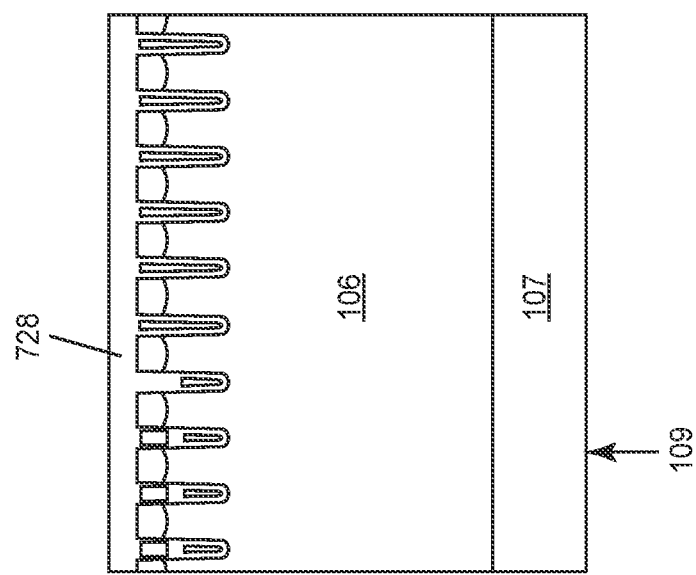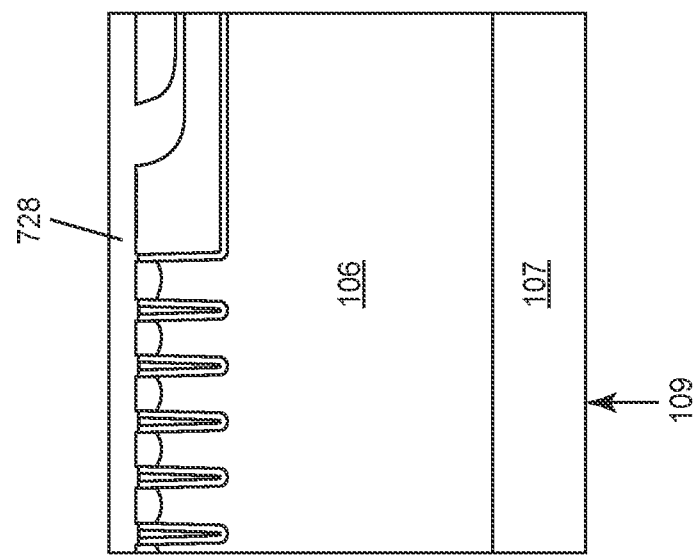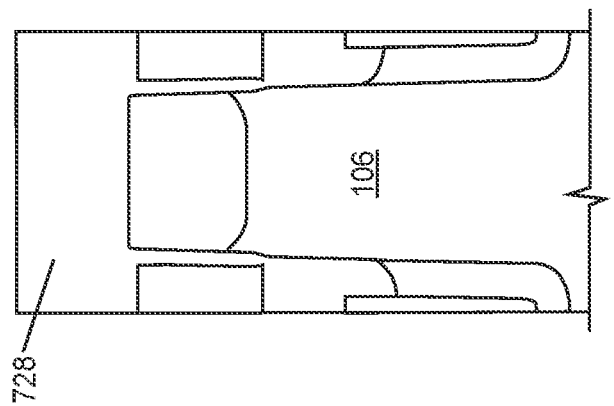
Figure 7P

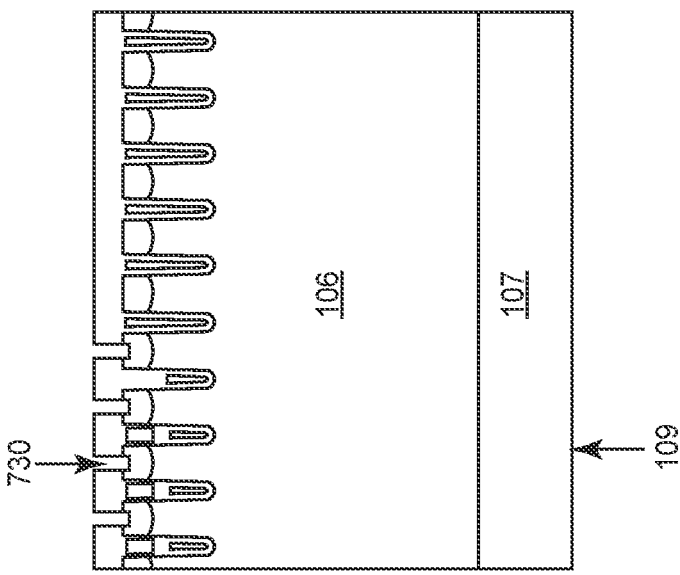
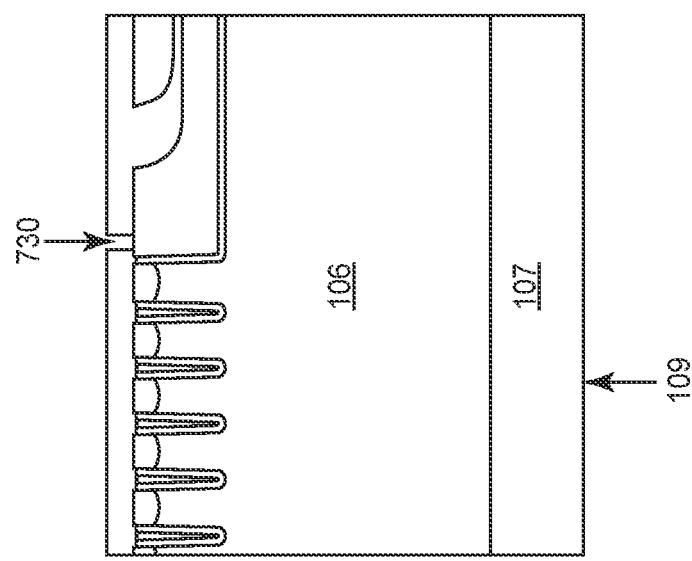
Figure 7Q
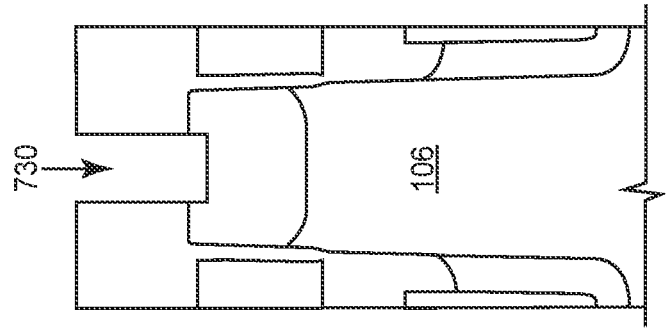

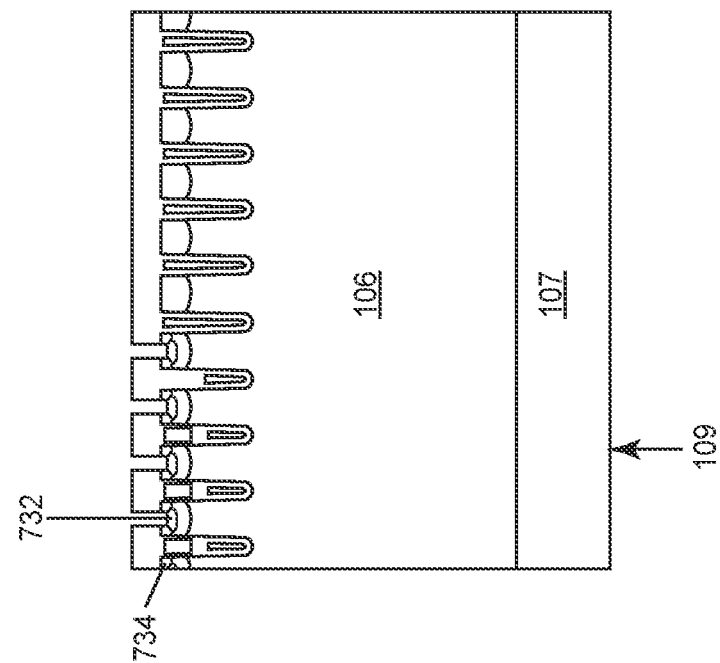
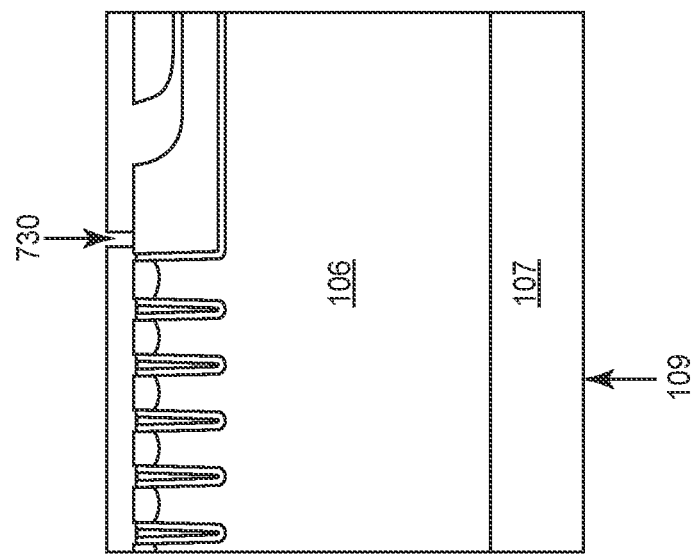
Figure 7R
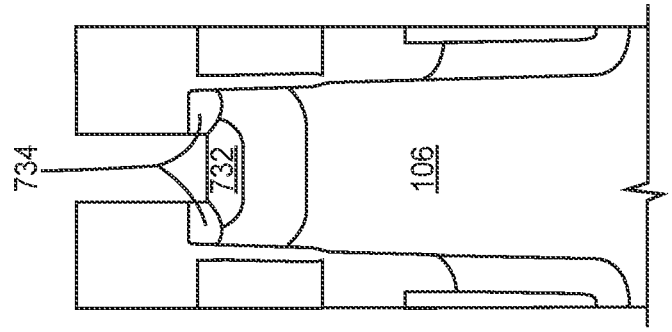

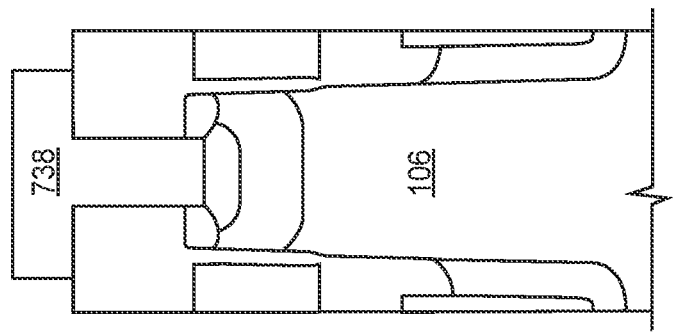
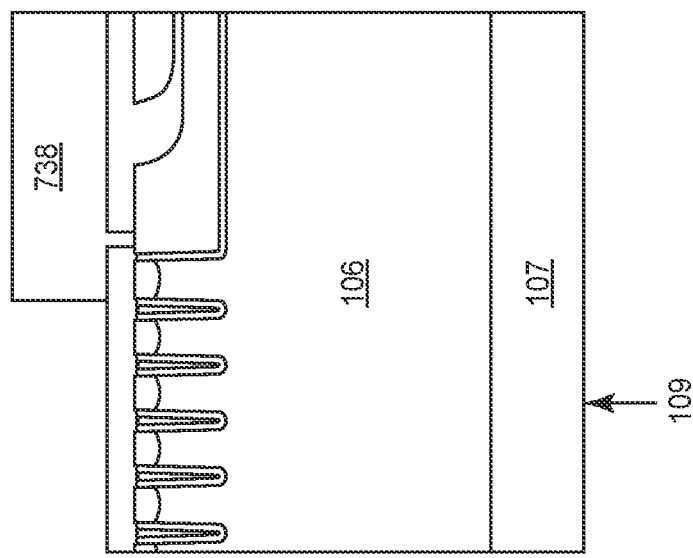
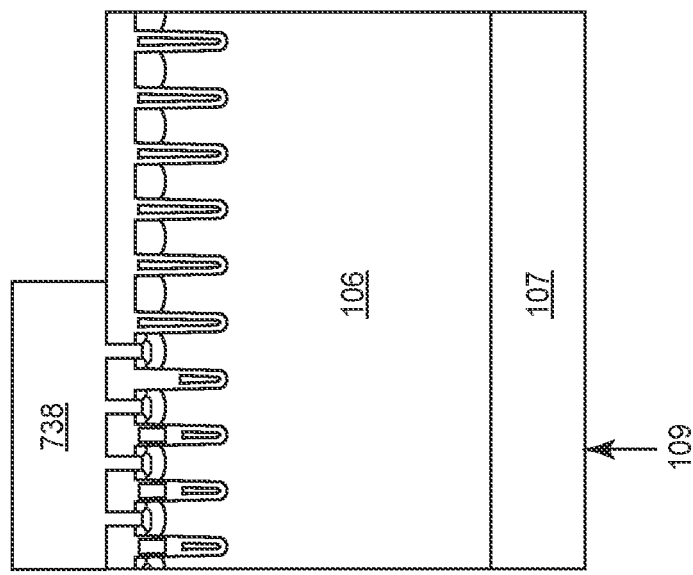
Figure 7S

TRENCH FIELD ELECTRODE TERMINATION STRUCTURE FOR TRANSISTOR DEVICES

BACKGROUND

Charge-balanced trench field-plate MOSFETs (metal-oxide-semiconductor field-effect transistors) are commonly used in DC-DC buck converters to step down the voltage from input to output. These devices can achieve the desired breakdown voltage rating with higher drift region doping due to a charge balance mechanism. As a result, these devices offer low on-resistance (Rdson) and gate charge (Qgd, Qg); thereby reducing conduction and switching losses, and enabling an improvement in overall system efficiency.

The edge termination design, however, requires careful attention and should be designed in a way that can achieve a similar extent of charge balance in the edge termination as in the active cells. Often times the edge termination becomes the limiting part of the design and device performance may need to be reduced to improve termination robustness.

The buried field electrode in the edge termination region should have a low resistance electrical connection to the desired potential, for example, source or gate potential, for effective 2-dimensional charge coupling in the device to achieve optimal performance. The field electrode resistance also determines how fast the MOSFET cells can transition from on-state to off-state and vice-versa, which can greatly influence the dynamic behavior of the device during switching. As switching frequencies for these applications continue to increase, dead-time requirements become more stringent and the underlying MOSFET devices must switch on and off very quickly, making it desirable to have a low resistance connection to the field electrode.

However, forming a good ohmic connection to the buried field electrode introduces processing complexities such as accessing the field electrode beneath the gate electrode in the same trench and making the metallic connection, for example, to the bulk of the source metal.

Thus, there is a need for an improved trench field electrode termination structure for transistor devices and methods of manufacturing thereof.

SUMMARY

According to an embodiment of a semiconductor device, the semiconductor device comprises: a trench formed in a first main surface of a semiconductor substrate and extending lengthwise in a direction parallel to the first main surface; a body region of a second conductivity type adjoining the trench; a source region of a first conductivity type adjoining the trench above the body region; a drift region of the first conductivity type adjoining the trench below the body region; a field electrode disposed in a lower part of the trench and separated from the semiconductor substrate; and a gate electrode disposed in an upper part of the trench and separated from the semiconductor substrate and the field electrode, wherein a first section of the field electrode is buried below the gate electrode in the trench, wherein a second section of the field electrode transitions upward from the first section in a direction toward the first main surface, wherein the separation between the second section of the field electrode and the gate electrode is greater than or equal to the separation between the first section of the field electrode and the gate electrode.

According to an embodiment of a method of producing a semiconductor device, the method comprises: forming a trench in a first main surface of a semiconductor substrate, the trench extending lengthwise in a direction parallel to the first main surface; forming a field electrode in a lower part of the trench and separated from the semiconductor substrate; forming a gate electrode in an upper part of the trench and separated from the semiconductor substrate and the field electrode so that a first section of the field electrode is buried below the gate electrode in the trench, a second section of the field electrode transitions upward from the first section in a direction toward the first main surface, and the separation between the second section of the field electrode and the gate electrode is greater than or equal to the separation between the first section of the field electrode and the gate electrode; forming a body region of a second conductivity type adjoining the trench; forming a source region of a first conductivity type adjoining the trench above the body region; and forming a drift region of the first conductivity type adjoining the trench below the body region.

According to another embodiment of a method of producing a semiconductor device, the method comprises: forming trenches in a first main surface of a semiconductor substrate, the trenches extending lengthwise in a direction parallel to the first main surface; forming a field electrode in a lower part of the trenches and separated from the semiconductor substrate; forming a gate electrode in an upper part of the trenches and separated from the semiconductor substrate and the field electrode so that a first section of the field electrode is buried below the gate electrode in the trenches, a second section of the field electrode transitions upward from the first section in a direction toward the first main surface in an intermediate part of the trenches between opposing ends of the trenches, and the separation between the second section of the field electrode and the gate electrode is greater than or equal to the separation between the first section of the field electrode and the gate electrode; forming body regions of a second conductivity type adjoining the trenches; forming source regions of a first conductivity type adjoining the trenches above the body regions; forming a drift region of the first conductivity type adjoining the trenches below the body regions; and forming an electrically conductive layer above the trenches and which is electrically connected to the field electrode in the trenches at the second section and has a lengthwise extension which is transverse to the lengthwise extension of the trenches.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 6A through 6F illustrate partial schematic views during different stages of a method of producing the intermediate field electrode connection arrangement shown in FIG. 2, according to another embodiment.

DETAILED DESCRIPTION

The embodiments described herein provide a trench field electrode termination structure for transistor devices which enables easy electrical connection to the field electrode with robust dielectric breakdown characteristics at the point of electrical connection, and methods of manufacturing such a device. The trench is formed in a main surface of a semiconductor substrate and extends lengthwise in a direction parallel to the main surface. A field electrode is formed in a lower part of the trench and separated from the semiconductor substrate. A gate electrode for the device is formed in an upper part of the trench and separated from the semiconductor substrate and the field electrode. A first section of the field electrode is buried below the gate electrode in the trench. A second section of the field electrode transitions upward from the first section in a direction toward the first main surface, to enable a low resistance electrical connection to the desired potential, for example, source or gate potential. The separation between the second section of the field electrode and the gate electrode is greater than or equal to the separation between the first section of the field electrode and the gate electrode, thereby providing robust dielectric breakdown characteristics at the point of electrical connection to the field electrode.

Figure 1:
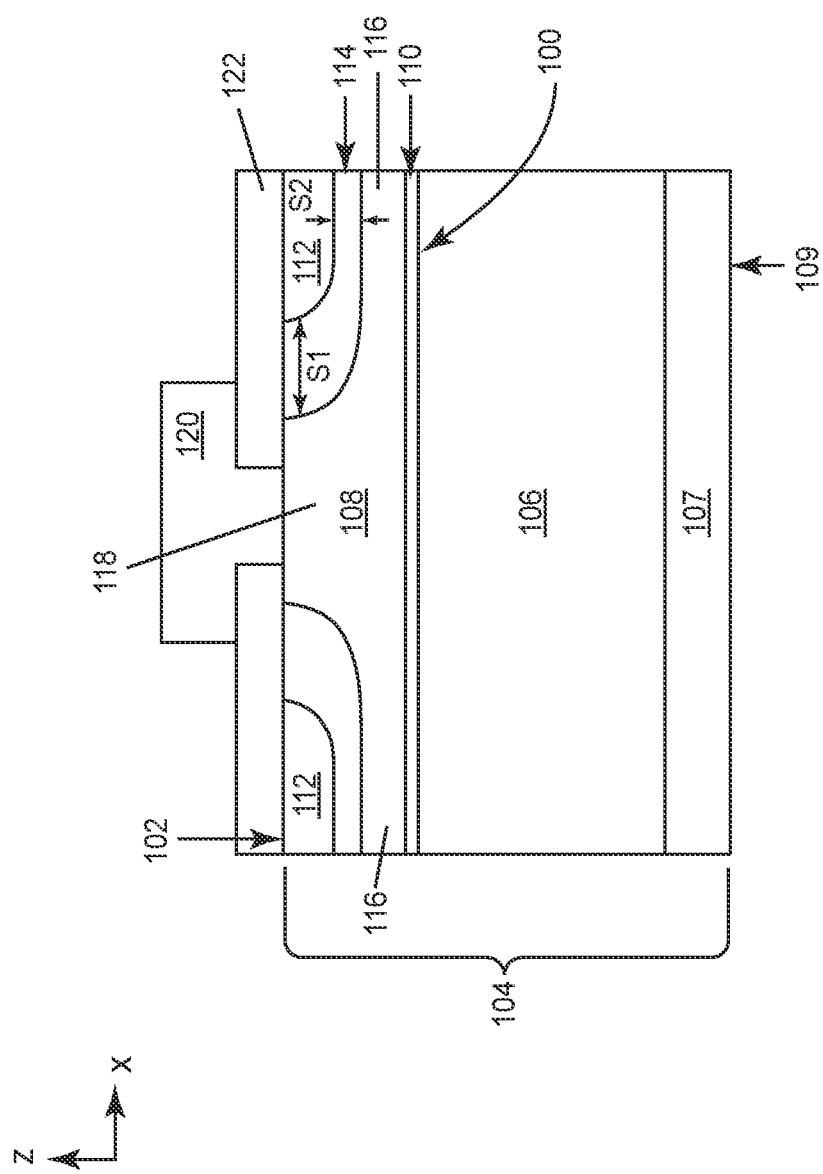
FIG. 1 illustrates a cross-sectional view of part of a semiconductor device having a structure connecting source metal to a field plate electrode.

FIG. 1 illustrates a cross-sectional view of part of a semiconductor device. The part of the device illustrated includes a trench 100 formed in a first main surface 102 of a semiconductor substrate 104. The semiconductor substrate 104 may include a semiconductor base and one or more epitaxial layers grown on the semiconductor base. The semiconductor substrate 104 may be made of a single semiconductor such as Si, Ge, etc. or may be made of a compound semiconductor such as SiC, GaN, SiGe, etc.

The trench 100 extends lengthwise in a direction 'x' parallel to the first main surface 102 of the semiconductor substrate 104. The cross-section illustrated in FIG. 1 is taken along the lengthwise extension of the trench 100. A body region of a second conductivity type adjoins the trench 100. A source region of a first conductivity type also adjoins the trench 100, above the body region. The body and source regions are positioned along both longitudinal sides of the trench 100 and therefore are out of view in FIG. 1. A drift region 106 of the first conductivity type adjoins the trench 100 below the body region, and a drain region 107 of the first conductivity type is between the drift region 106 at the second main surface 109 of the semiconductor substrate 104. The drift region 106 may be an epitaxial region grown on the semiconductor substrate 104, e.g., before the trench 100 is formed. In the case of an n-channel device, the first conductivity type is n-type and the second conductivity type is p-type. Conversely, the first conductivity type is p-type and the second conductivity type is n-type in the case of a p-channel device.

A field electrode 108 is disposed in a lower part of the trench 100 and separated from the semiconductor substrate 104 by a dielectric 110 such as an oxide. A gate electrode 112 is disposed in an upper part of the trench 100 and separated from the semiconductor substrate 104 and the field electrode 109 by one or more dielectrics 114. The field electrode 108, when biased accordingly, balances the charge in the drift region 106 to increase breakdown voltage of the device.

To facilitate easy electrical connection to the buried field electrode 108 and without compromising the breakdown characteristic of the dielectric 114 at the point of electrical connection, a first section 116 of the field electrode 108 is buried below the gate electrode 112 in the trench 100 and a second section 118 of the field electrode 108 transitions upward from the first section 116 in a direction toward the first main surface 102 of the semiconductor substrate 104. The second section 118 of the field electrode 108 provides for a low resistance electrical connection to a desired potential, for example, source or gate potential, via a corresponding electrode 120 which is formed on an interlayer dielectric 122. The lateral separation 'S1' between the second section 118 of the field electrode 108 and the gate electrode 112 is greater than or equal to the vertical separation 'S2' between the first section 116 of the field electrode 108 and the gate electrode 112 to ensure robust dielectric breakdown characteristics at the point of electrical connection. In one embodiment, the lateral separation 'S1' between the second section 118 of the field electrode 108 and the gate electrode 112 is greater than the vertical separation 'S2' between the first section 116 of the field electrode 108 and the gate electrode 112.

Such separation is realized in accordance with various processing methods described later herein and according to which first and second lithographic layers are used to enable an electrical connection to the buried field electrode 108 without compromising the dielectric breakdown characteristics at the point of electrical connection.

Figure 2:
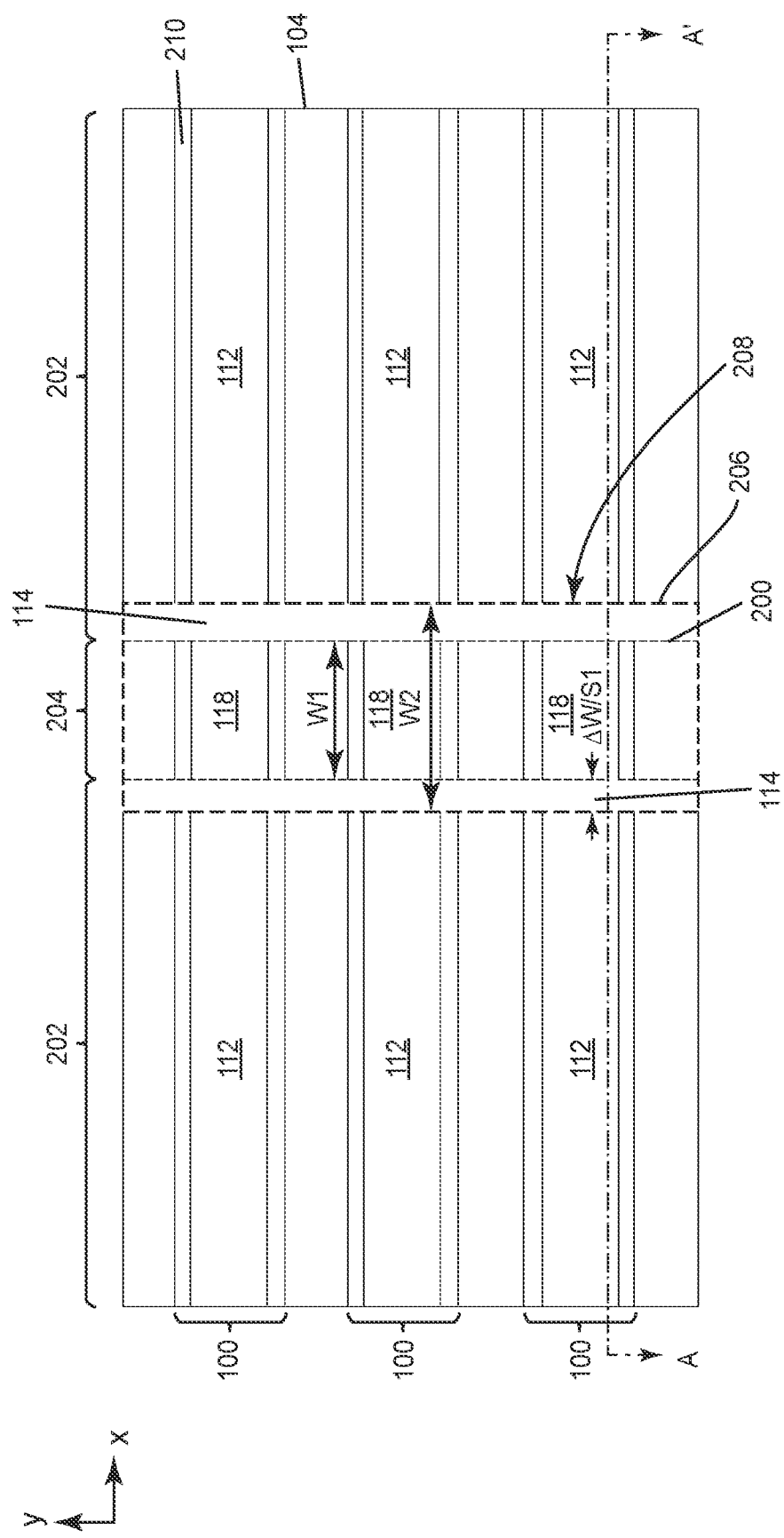
FIG. 2 illustrates a partial top plan view of the semiconductor device shown in FIG. 1.

FIG. 2 illustrates a partial top plan view of the semiconductor device shown in FIG. 1, with the interlayer dielectric 122 omitted so as to provide an unobstructed view of the gate electrode 112 and the second section 118 of the field electrode 108 at the first main surface 102 of the semiconductor substrate 104. FIG. 2 shows multiple trenches 100 in parallel, each trench 100 having the construction shown in FIG. 1. The cross-sectional view of FIG. 1 is taken along the line labelled A-A' in FIG. 2.

After a first dielectric material (out of view in FIG. 2) lines the bottom and sidewalls of the trenches 100 and a field electrode material is deposited in the dielectric lined trenches 100, a first lithographic layer 200 is used as a mask to selectively thin the field electrode material in an active area 202 of the device while allowing the field electrode material to remain closer to the first main surface 102 of the substrate 104 in an electrode connection/bus region 204 of the device. The second section 118 of the field electrode 108 corresponds to where the field electrode material is protected by the first lithographic layer 200 and allowed to remain closer to the first main surface 102 of the substrate 104. The second section 118 of the field electrode 108 facilitates electrical connection of the buried field electrode 108 to the desired potential such as source potential, gate potential, etc. The corresponding overlying electrode is not shown in FIG.

2 to provide an unobstructed view of the trench structure in the electrode connection/bus region 204 of the device. The first lithographic layer 200 has a width W1 in FIG. 2.

After depositing or growing the dielectric 114 and thinning the field electrode material in the active area 202 of the device, a second lithographic layer 206 is used to define the lateral separation 'S1' between the second section 118 of the field electrode 108 and the edge 208 of the gate electrode 112 facing the second section 118 of the field electrode 108. The dielectric material 114 that separates the field electrode 118 from the gate electrode 112 is thinned partly or completely to the buried first section 116 of the field electrode 108 in those regions unprotected by the second lithographic layer 206, and a gate dielectric 210 is formed on the exposed part of the upper sidewalls of the trenches 100 in the active area 202 of the device.

The second lithographic layer 206 has a width W2 in FIG. 2 which is greater than the width W1 of the first lithographic layer 200. The difference ΔW between W2 and W1, also referred to herein as overhang, defines the amount of lateral separation 'S1' shown in FIG. 1 between the second section 118 of the field electrode 108 and the gate electrode 112 at or near the first main surface 102 of the semiconductor substrate 104. The width W1 of the first lithographic layer 200 and the width W2 of the second lithographic layer 206 are chosen so that the width difference/overhang ΔW results in the lateral separation 'S1' shown in FIG. 1 between the second section 118 of the field electrode 108 and the gate electrode 112 being greater than or equal to the vertical separation 'S2' shown in FIG. 1 between the first section 116 of the field electrode 108 and the gate electrode 112. In other words, the widths of the first and second lithographic layers 200, 206 determines the degree to which the lateral separation 'S1' between the second section 118 of the field electrode 108 and the gate electrode 112 is greater than or equal to the vertical separation 'S2' between the first section 116 of the field electrode 108 and the gate electrode 112.

In FIG. 2, the second section 118 of the field electrode 108 transitions upward from the first section 116 in an intermediate part of each trench 100 between opposing ends of the gate electrode 112. An electrically conductive layer 120 formed above the trenches 100 in the electrode connection/bus region 204 of the device, e.g. as shown in FIG. 1, is electrically connected to each field electrode 108 at the second section 118 and has a lengthwise extension in direction 'y' which is transverse to the lengthwise extension of the trenches 100 in direction 'x'. In FIGS. 1 and 2, directions 'x' and 'y' are horizontal directions with respect to the first main surface 102 of the semiconductor substrate 104, and direction 'z' is a vertical direction with respect to the first main surface 102 of the semiconductor substrate 104.

Figure 3:
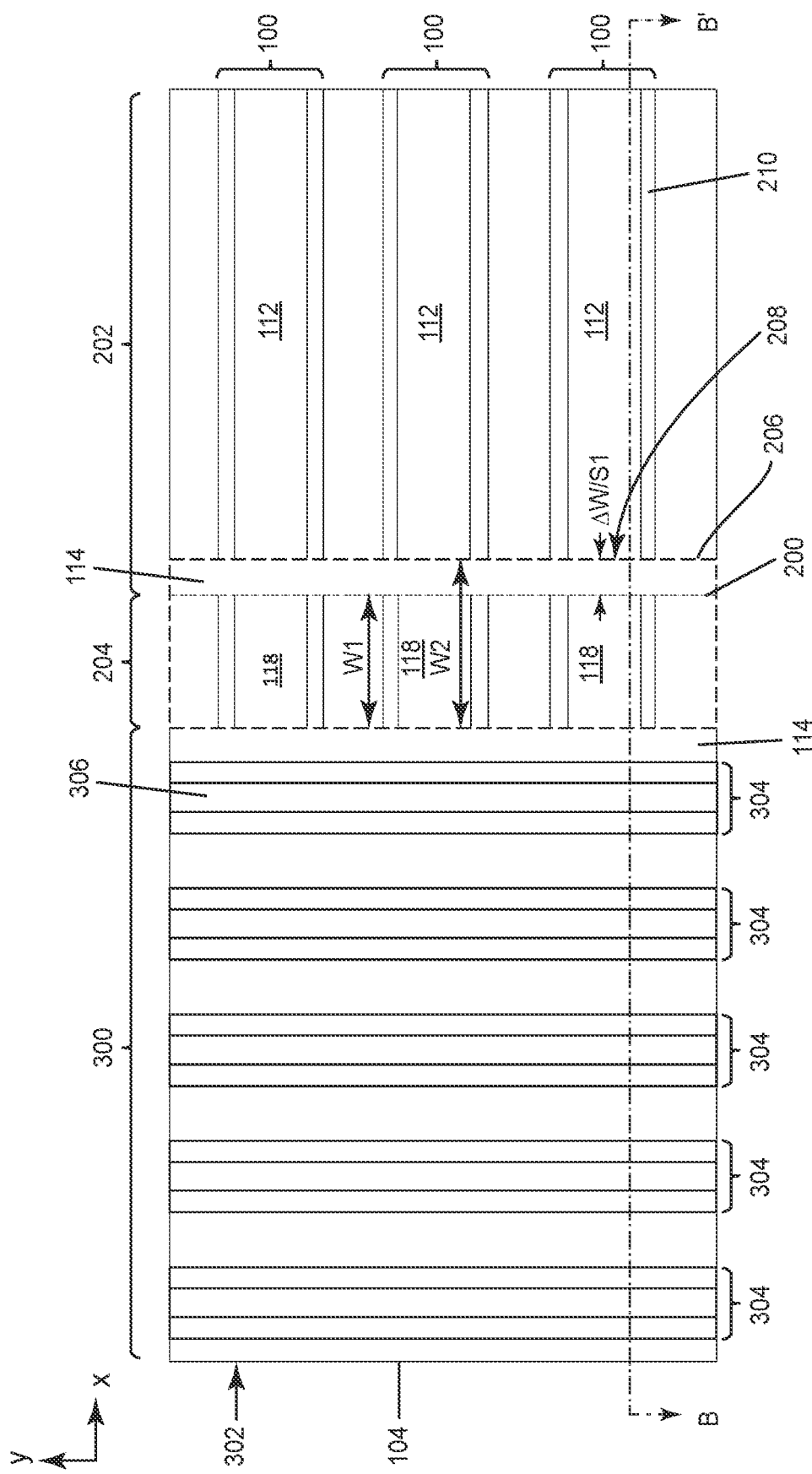
FIG. 3 illustrates another partial top plan view of the semiconductor device shown in FIG. 1, in a different part of the device than what is shown in FIG. 2.

FIG. 3 illustrates another partial top plan view of the semiconductor device shown in FIG. 1, in a different part of the device than what is shown in FIG. 2. Similar to FIG. 2, the interlayer dielectric is omitted in FIG. 3 to provide an unobstructed view of the gate electrode 112 and second section 118 of the field electrode 108 at the first main surface 102 of the semiconductor substrate 104. In FIG. 3, the second section 118 of the field electrode 108 transitions upward from the first section 116 at the end of each trench 100 which is adjacent an edge termination region 300 formed in the semiconductor substrate 104. The edge termination region 300 is positioned between the active area 202 of the device and an edge 302 of the semiconductor substrate 104. The edge termination region 300 may include termination trenches 304 with electrodes 306 for supporting the voltage of the device but which do not contribute to the main current path of the device. Such termination trenches are well known in the power semiconductor art, and therefore no further description of the termination trenches 304 is provided.

Figure 4:
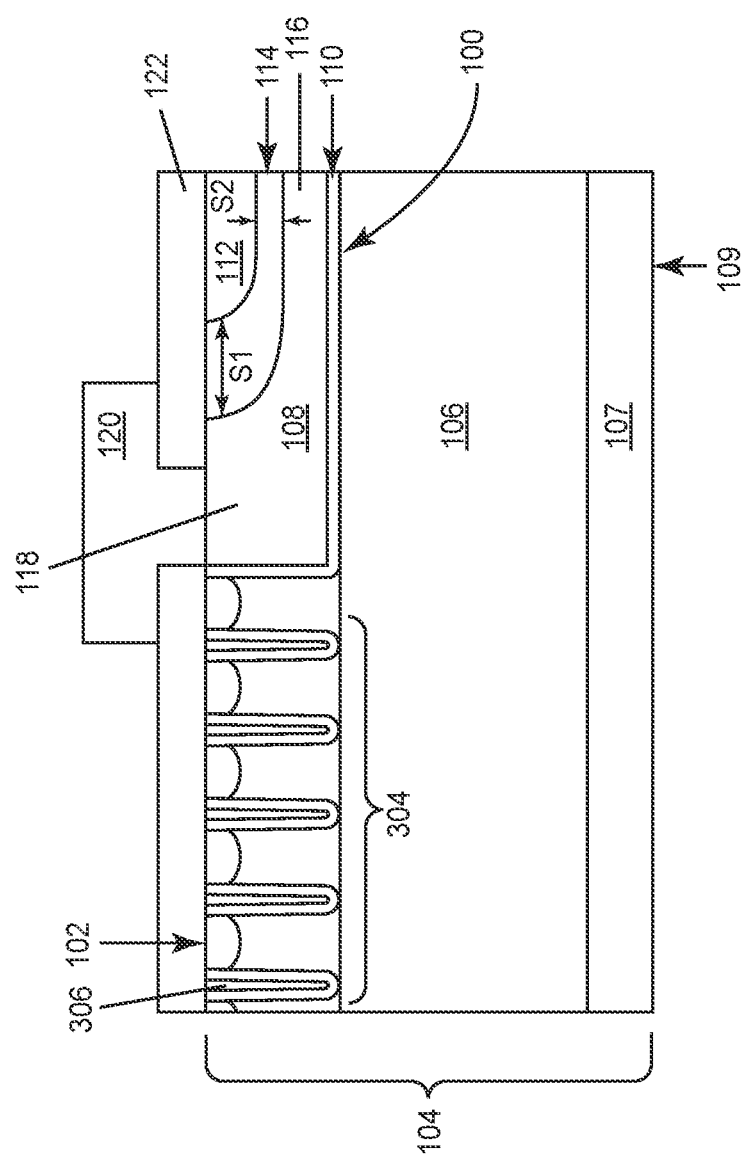
FIG. 4 illustrates a cross-sectional view of the device along the line labeled B-B' in FIG. 3.

FIG. 4 shows a cross-sectional view of the device along the line labeled B-B' in FIG. 3.

As in FIG. 2, the difference/overhang ΔW between the with W2 of the second lithographic layer 206 and the width W1 of the first lithographic layer 200 determines the amount of lateral separation 'S1' shown in FIG. 4 between the second section 118 of the field electrode 108 and the gate electrode 112 at or near the first main surface 102 of the semiconductor substrate 104. The width W1 of the first lithographic layer 200 and the width W2 of the second lithographic layer 206 are chosen so that the width difference/overhang ΔW results in the lateral separation 'S1' shown in FIG. 4 between the second section 118 of the field electrode 108 and the gate electrode 112 being greater than or equal to the vertical separation 'S2' shown in FIG. 4 between the first section 116 of the field electrode 108 and the gate electrode 112.

The semiconductor device may include both the intermediate field electrode connection arrangement shown in FIG. 2 and the end field electrode connection arrangement shown in FIG. 3, or one of the field electrode connection arrangements shown in FIGS. 2 and 3 but not the other.

FIGS. 5A through 5F illustrate partial schematic views during different stages of a method of producing the intermediate field electrode connection arrangement shown in FIG. 2.

Figure 5A:
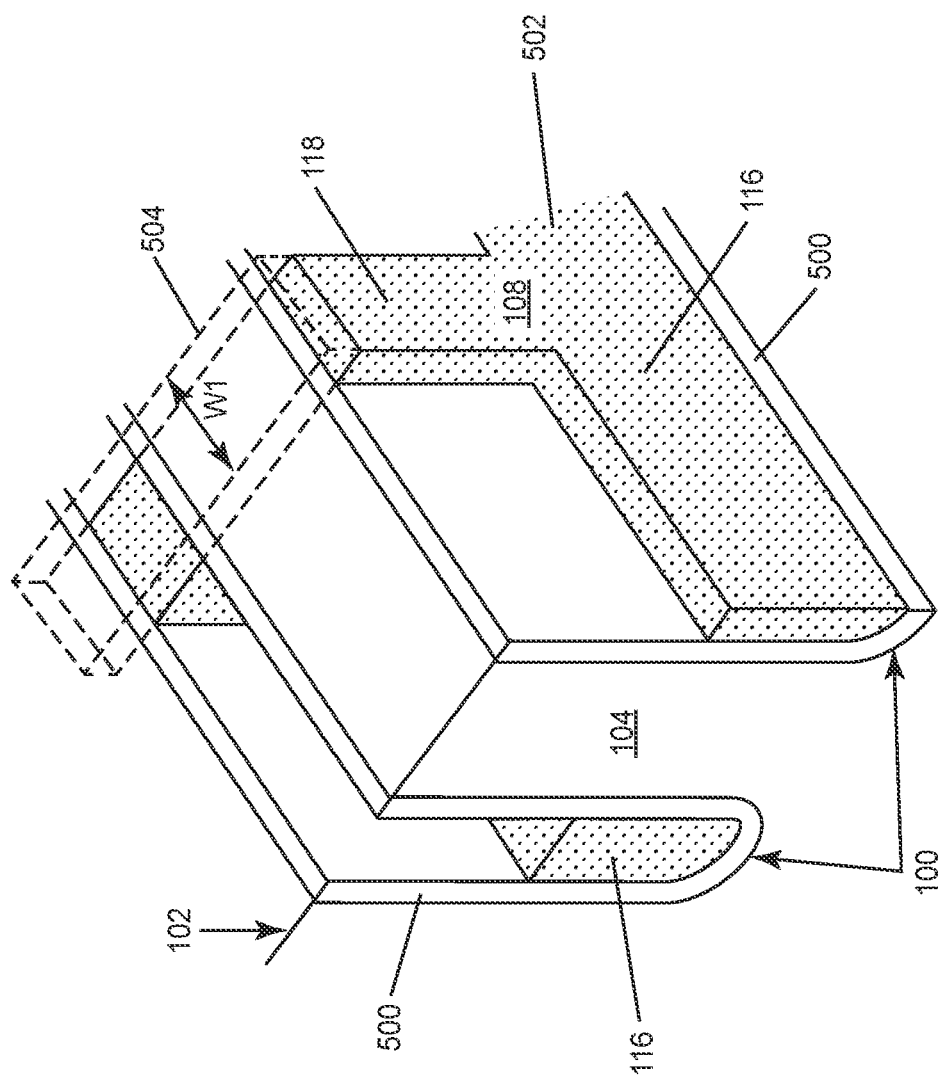
FIGS. 5A through 5F illustrate partial schematic views during different stages of a method of producing the intermediate field electrode connection arrangement shown in FIG. 2.

FIG. 5A shows the semiconductor substrate 104 after forming the trenches 100 in the first main surface 102 of the semiconductor substrate 104, lining a bottom and sidewalls of the trenches 100 with a first dielectric 500, filling the trenches 100 with an electrically conductive material 502 such as polysilicon and/or metal after lining the bottom and sidewalls of the trenches 100 with the first dielectric 500, and thinning part of the electrically conductive material 502 to form the first and the second sections 116, 118 of the field electrode 108 in each trench 100. Although not shown in FIG. 5A, the first dielectric 500 may also be on the first main surface 102 of the semiconductor substrate 104 to protect the mesa section 104 between the trenches 100 during subsequent etching.

A first mask 504 having a width W1 is used to selectively thin the field electrode material 502 in the active area 202 of the device while allowing the field electrode material 502 to extend to the first main surface 102 of the substrate 104 in the electrode connection/bus region 204 of the device. The first mask 504 protects a portion of the electrically conductive material 502 which corresponds to the second section 118 of the field electrodes 108. The part of the electrically conductive material 502 unprotected by the first mask 504 is thinned to define the first section 116 of the field electrodes 108.

The first mask 504 corresponds to the first lithographic layer previously described herein and is shown in FIG. 5A as a dashed box so as to not full obstruct the underlying trench structures. In one embodiment, first mask 504 is a photoresist used to cover the areas where the second section 118 of the field electrodes 108 are to be defined.

Figure 5B:
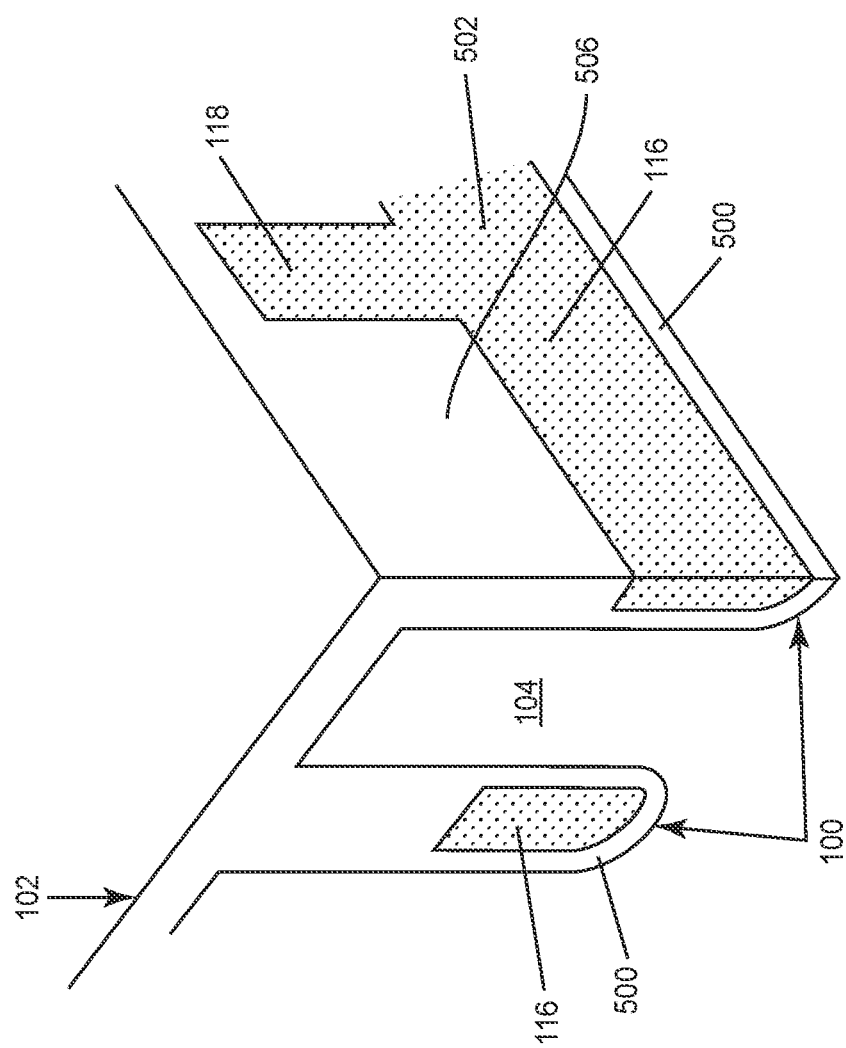

FIG. 5B shows the semiconductor substrate 104 after the space in the trenches formed by thinning the electrically conductive material is filled with a second dielectric 506. In one embodiment, the first dielectric 500 and the second dielectric 506 are the same type of dielectric material, e.g., silicon dioxide.

Figure 5C:
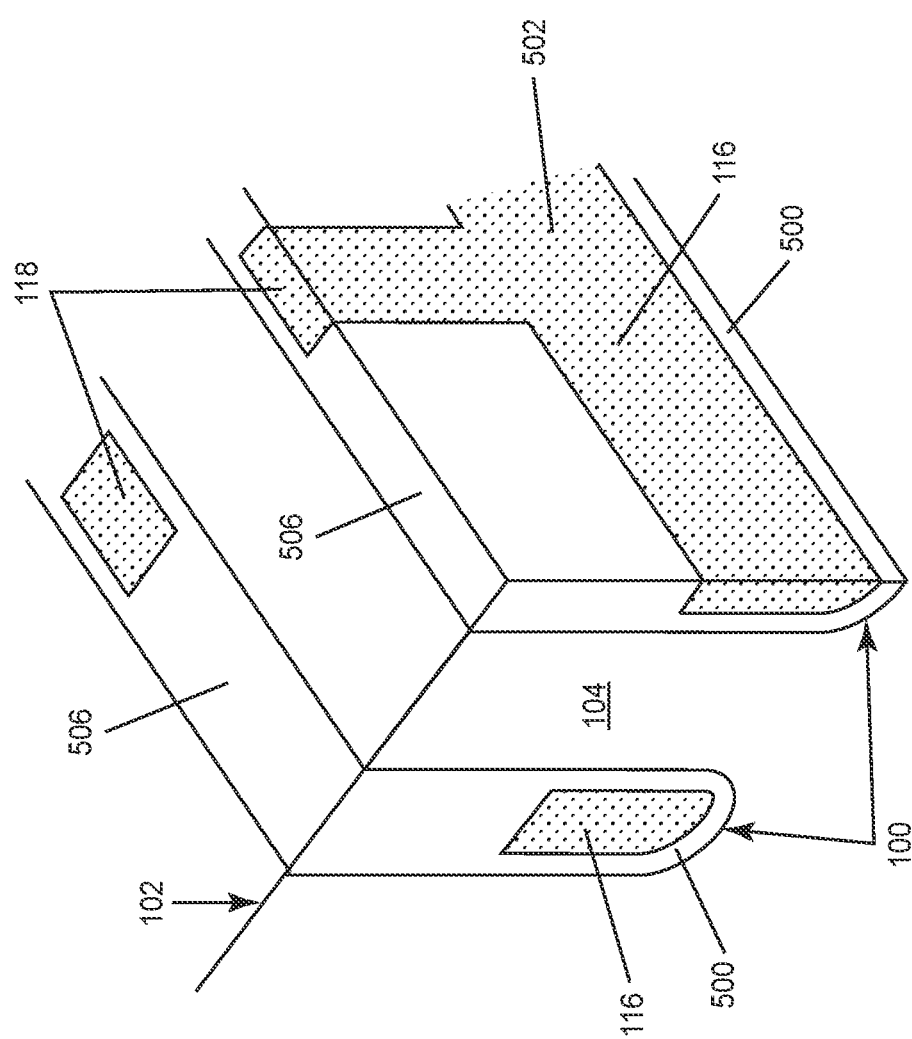

FIG. 5C shows the semiconductor substrate 104 after planarizing the second dielectric 506 over the first section 116 of each field electrode 108.

Figure 5D:
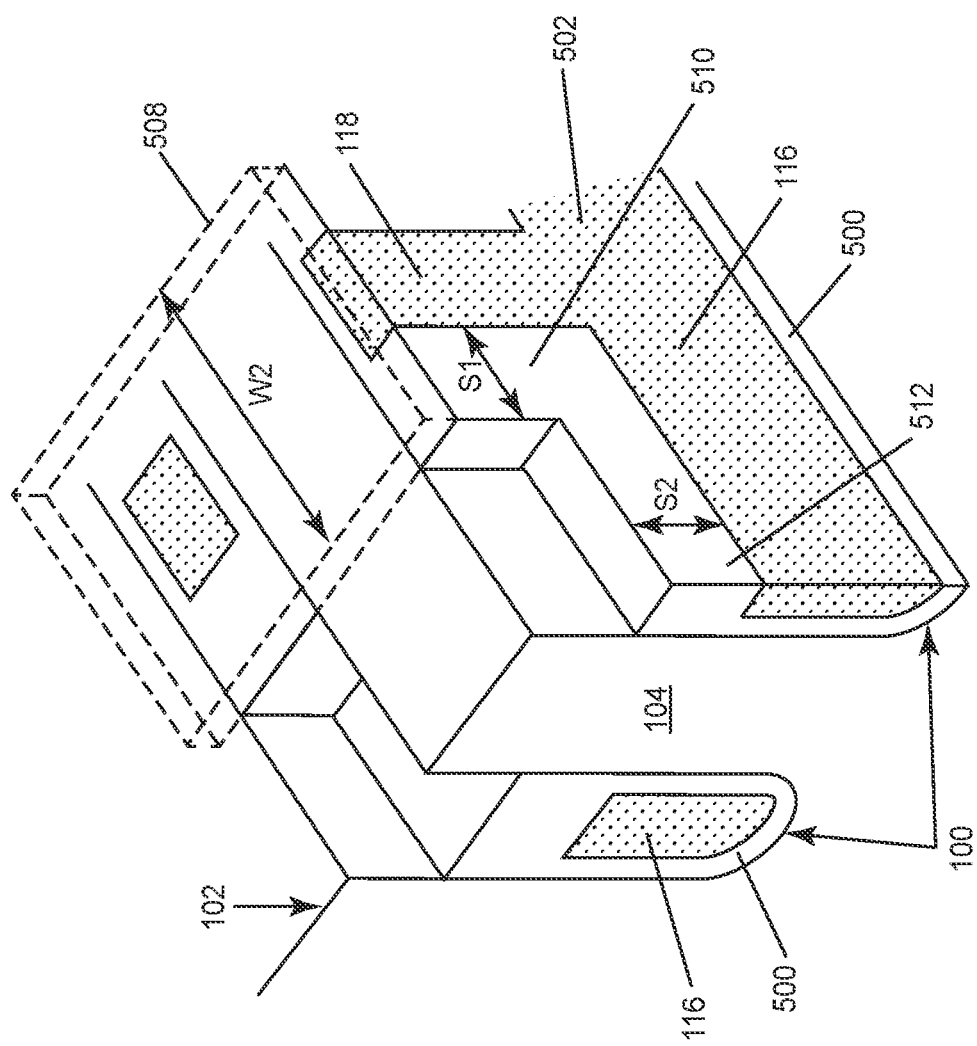

FIG. 5D shows the semiconductor substrate 104 after forming a second mask 508 which protects a part 510 of the second dielectric 506 adjoining the second section 118 of the field electrodes 108, and after thinning the part 512 of the second dielectric 506 unprotected by the second mask 508. The thinning of the exposed part 512 of the second dielectric 506 stops before reaching the buried first section 116 of the field electrodes 108, according to this embodiment. For example, a timed etch process may be employed and which stops before exposing the buried first section 116 of the field electrodes 108. The remaining thickness of the part 512 of the second dielectric 506 unprotected by the second mask 508 defines the vertical separation 'S2' between the first section 116 of the field electrode 108 and the gate electrode 112 to be formed in the trenches 100.

The second mask 508 corresponds to the second lithographic layer previously described herein, has a width W2, and is shown in FIG. 5D as a dashed box so as to not full obstruct the underlying trench structures. In one embodiment, the second mask 508 is a photoresist used to cover the area of separation 518 between the gate electrode 112 to be formed and the second section 118 of the field electrode 108 in the same trench 100. The overhang (W2−W1) between the second mask 508 and the first mask 504 defines the amount of lateral separation S1 between the second section 118 of the field electrode 108 and the gate electrode 112 to be formed in the same trench 100.

Figure 5E:
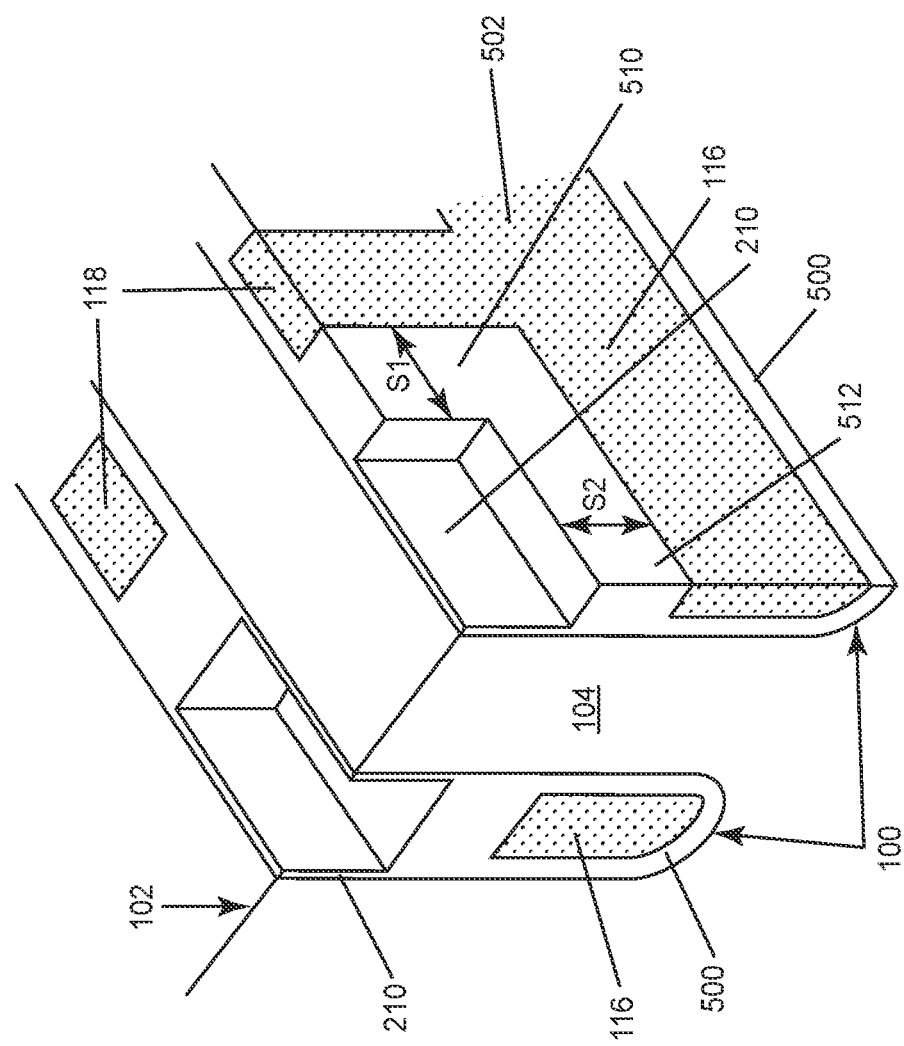

FIG. 5E shows the semiconductor substrate 104 after the gate dielectric 210 is formed on the exposed upper part of the trench sidewalls. Although not shown in FIG. 5E, the gate dielectric 210 may also be on the first main surface 102 of the semiconductor substrate 104.

Figure 5F:
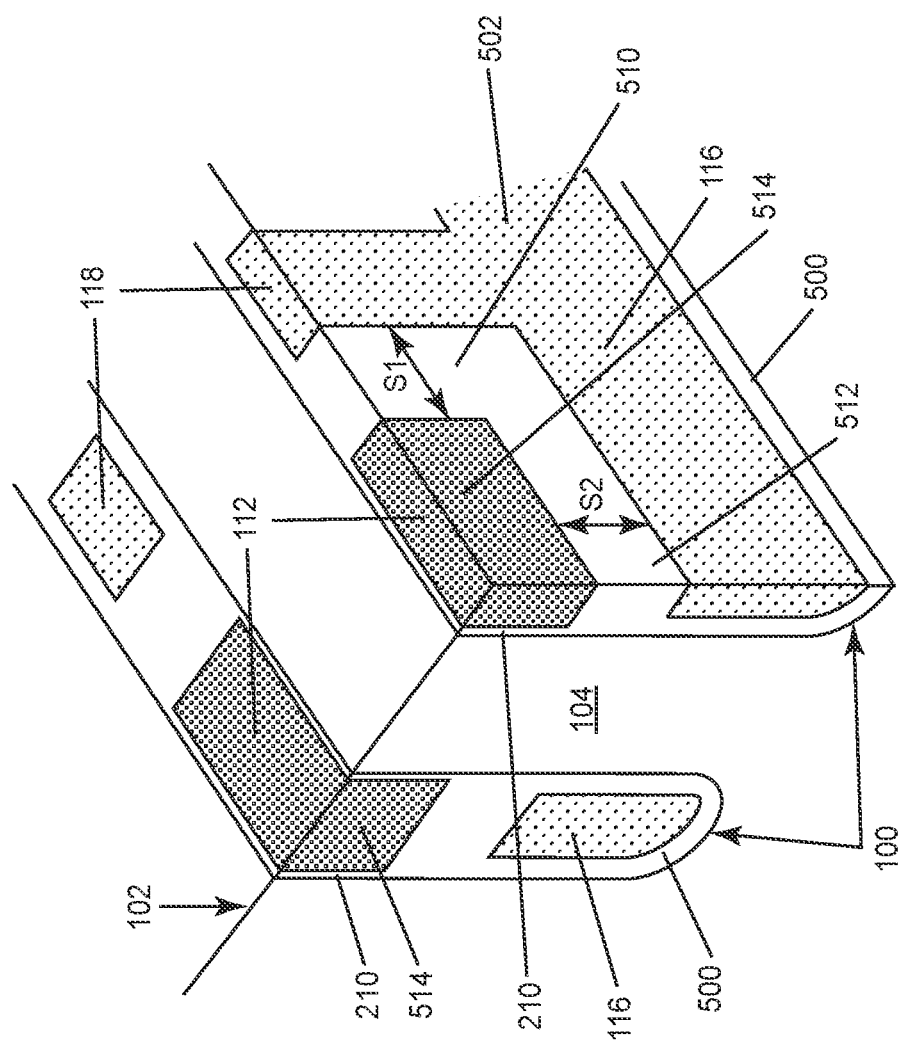

FIG. 5F shows the semiconductor substrate 104 after an electrically conductive material 514 such as polysilicon and/or metal is deposited in the trenches 100 and planarized to form the gate electrodes 112. The gate dielectric 210 separates the gate electrode 112 in each trench from the surrounding semiconductor substrate 104.

Figure 6A:
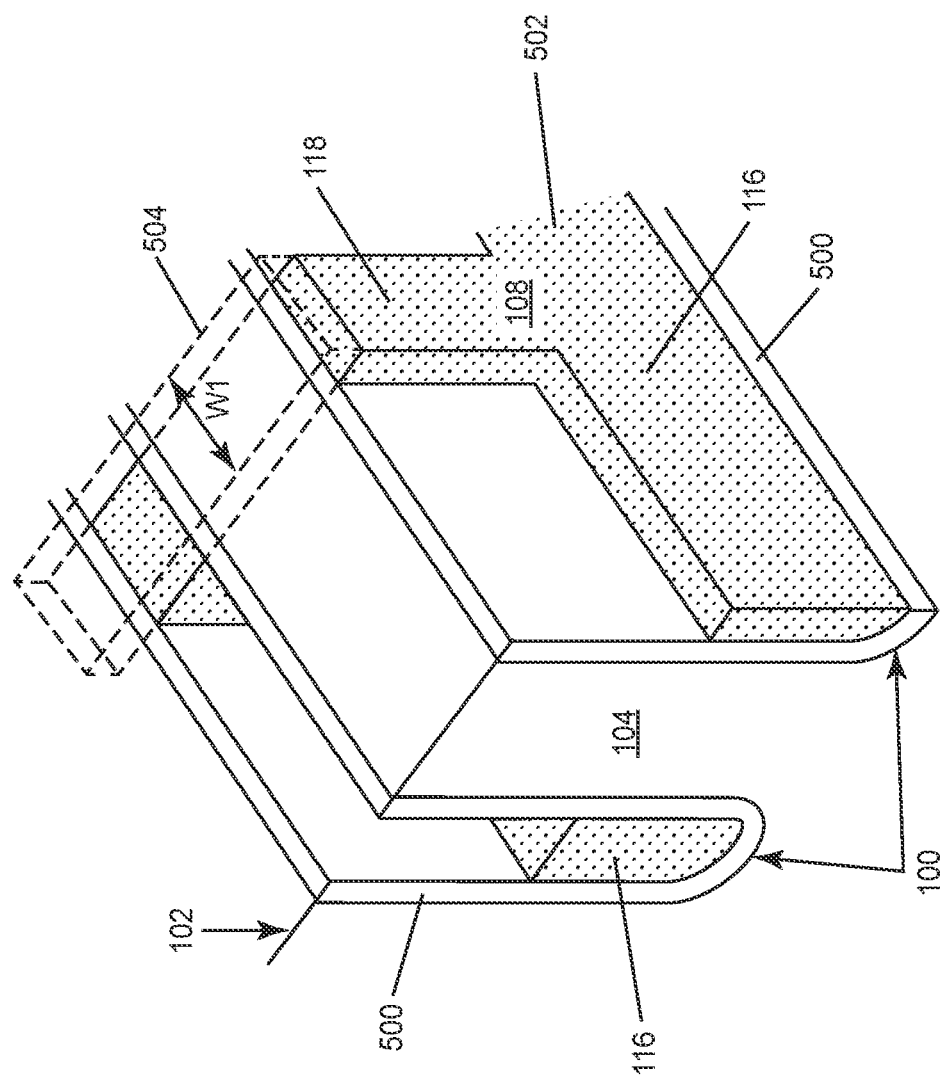
Figure 6B:
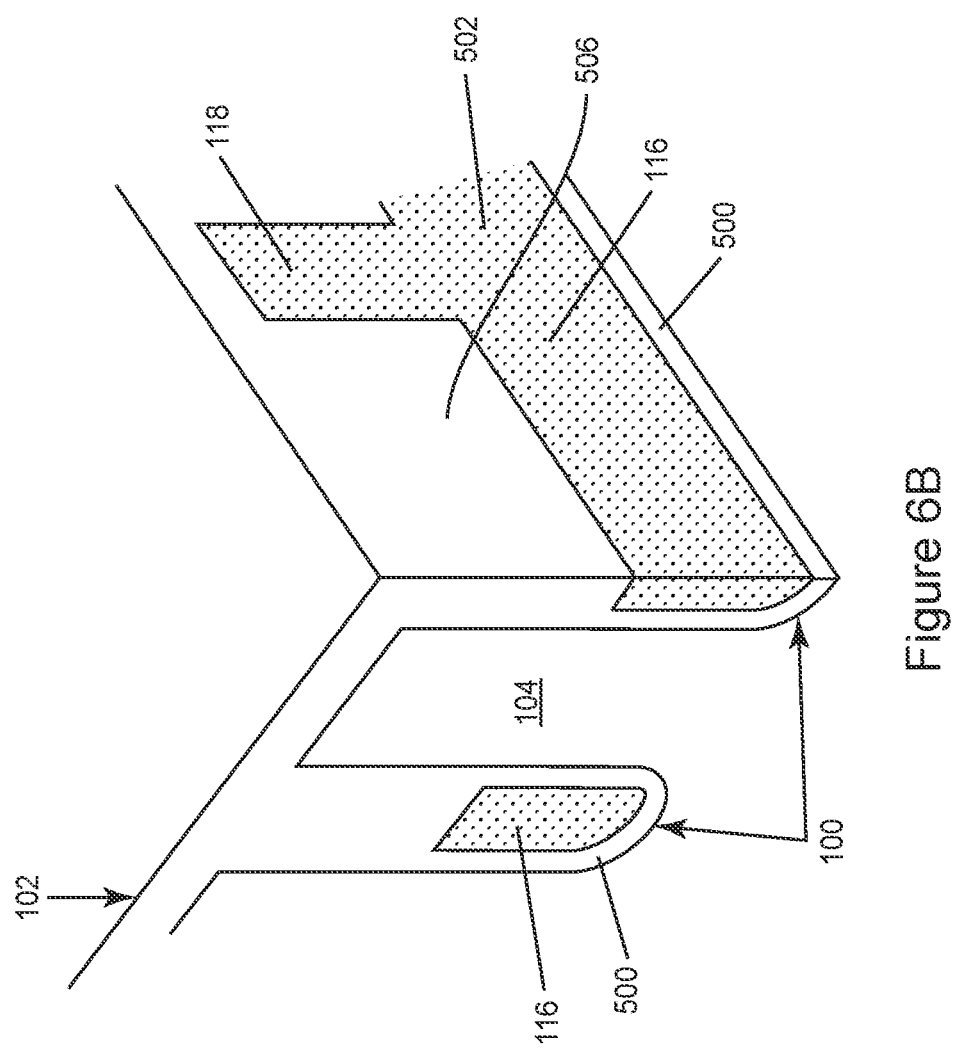

FIGS. 6A through 6F illustrate partial schematic views during different stages of a method of producing the intermediate field electrode connection arrangement shown in FIG. 2, according to another embodiment. The processing shown in FIGS. 6A through 6C corresponds to the processing shown in FIGS. 5A through 5C, respectively. Hence, no further description of FIGS. 6A through 6C is provided. Although not shown in FIG. 6A, the first dielectric 500 may also be on the first main surface 102 of the semiconductor substrate 104 to protect the mesa section 104 between the trenches 100 during subsequent etching. Although not shown in FIG. 6E, the gate dielectric 210 may also be on the first main surface 102 of the semiconductor substrate 104.

However, according to the embodiment illustrated in FIGS. 6A through 6F, the part 512 of the second dielectric 506 unprotected by the second mask 508 is thinned down to the buried first section 116 of the field electrodes 108. For example, the field electrode material 502 may be used as an etch stop in determining when to stop the etching process. Unlike the embodiment illustrated in FIG. 5D, the embodiment illustrated in FIG. 6D exposes the top surface of the first section 116 of the field electrodes 108. By etching the second dielectric 506 to expose the first section 116 of each field electrode 108, the second dielectric 506 remains only along sidewalls of the second section 118 of the field electrodes 108 where the part 510 of the second dielectric 506 is protected by the second mask 508.

Figure 6D:
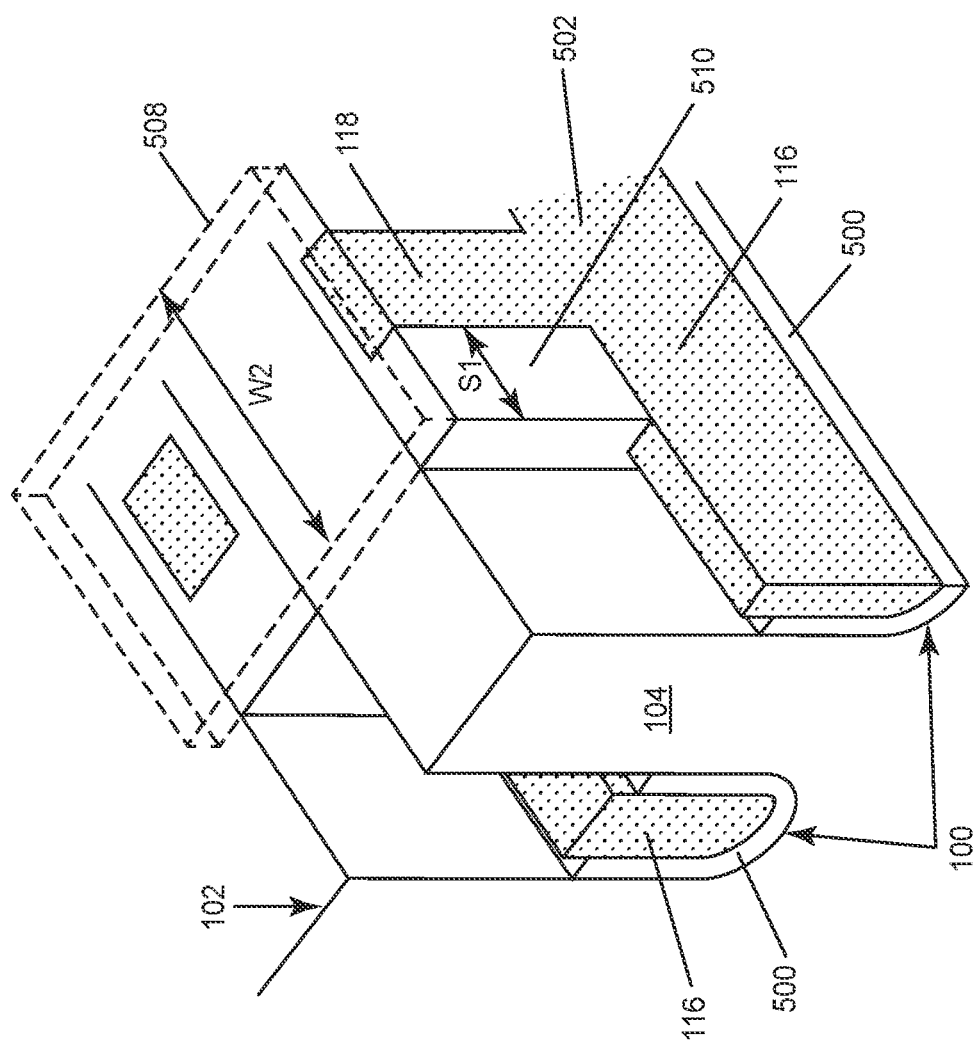
Figure 6E:
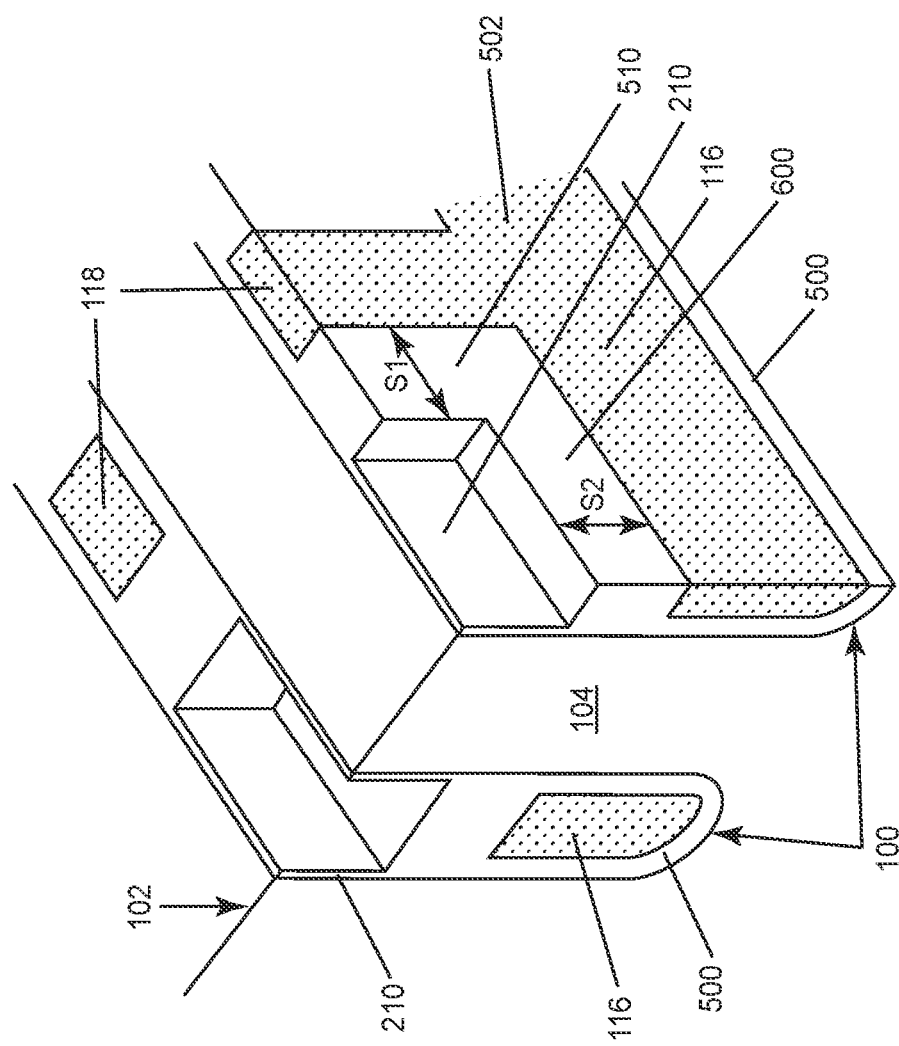

FIG. 6E shows the semiconductor substrate 104 after the gate dielectric 210 is formed on the exposed upper prat of the trench sidewalls, and an inter-electrode dielectric 600 is formed on the exposed part of the first section 116 of each field electrode 108. The thickness of the inter-electrode dielectric 600 defines the vertical separation 'S2' between the first section 116 of the field electrode 108 and the gate electrode 112 to be formed in the trenches 100, according to this embodiment.

In one embodiment, the gate dielectric 210 is formed along an upper (exposed) part of the trench sidewalls after exposing the first section 116 of the field electrodes 108 as shown in FIG. 6D and after depositing the inter-electrode dielectric 600 but before forming the gate electrode 112. Separately or in combination, the inter-electrode dielectric 600 may be deposited by high density plasma chemical vapor deposition. Another option is to use the enhanced oxidation rate of N-doped polysilicon field plate to form the inter-electrode dielectric 600 at the same time as the gate oxidation.

Figure 6F:
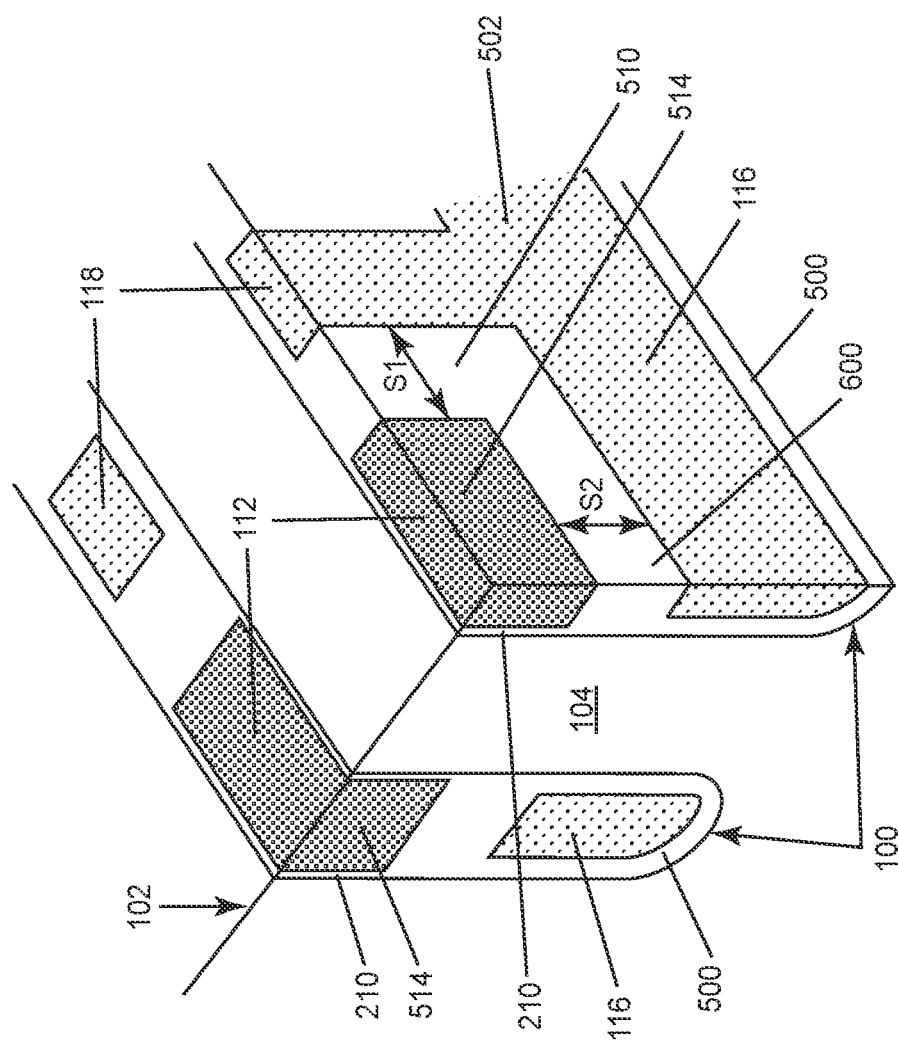

FIG. 6F shows the semiconductor substrate 104 after an electrically conductive material 514 such as polysilicon and/or metal is deposited in the trenches 100 and planarized to form the gate electrodes 112. The gate dielectric 210 separates the gate electrode 112 in each trench 100 from the surrounding semiconductor substrate 104, and the inter-electrode dielectric 600 separates each gate electrode 112 from the buried first section 116 of the field electrode 108 in the same trench 100.

Figure 7A:
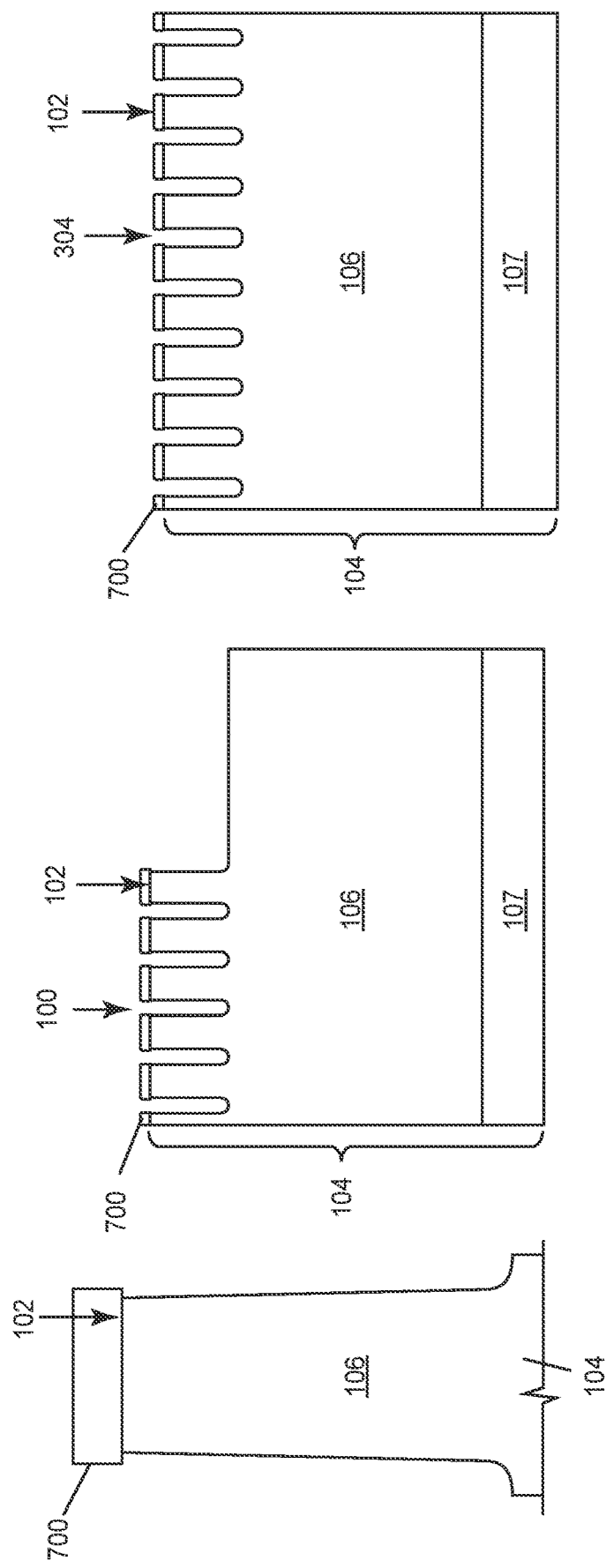
FIGS. 7A through 7S illustrate partial schematic views during different stages of a method of producing the end field electrode connection arrangement shown in FIGS. 3 and 4.

FIGS. 7A through 7S illustrate partial schematic views during different stages of a method of producing the end field electrode connection arrangement shown in FIGS. 3 and 4. The leftmost drawing of each of FIGS. 7A through 7S is a partial cross-section through the active area 202 of the device. The middle drawing of each of FIGS. 7A through 7S is a cross-section through a termination region where the active trenches 100 end. The rightmost drawing of each of FIGS. 7A through 7S is a cross-section through the edge termination region 300 of the device.

FIG. 7A shows a mask 700 formed on the first main surface 102 of the semiconductor substrate 104 and trenches 100, 304 etched into the first main surface 104 of the substrate 104 through openings in the mask 700. The trenches 100, 304 extend lengthwise in a direction parallel to the first main surface 102 of the substrate 104, and may be arranged in any desired pattern such as stripes, serpentine, etc. In one embodiment, the mask 700 is made of nitride.

Figure 7B:
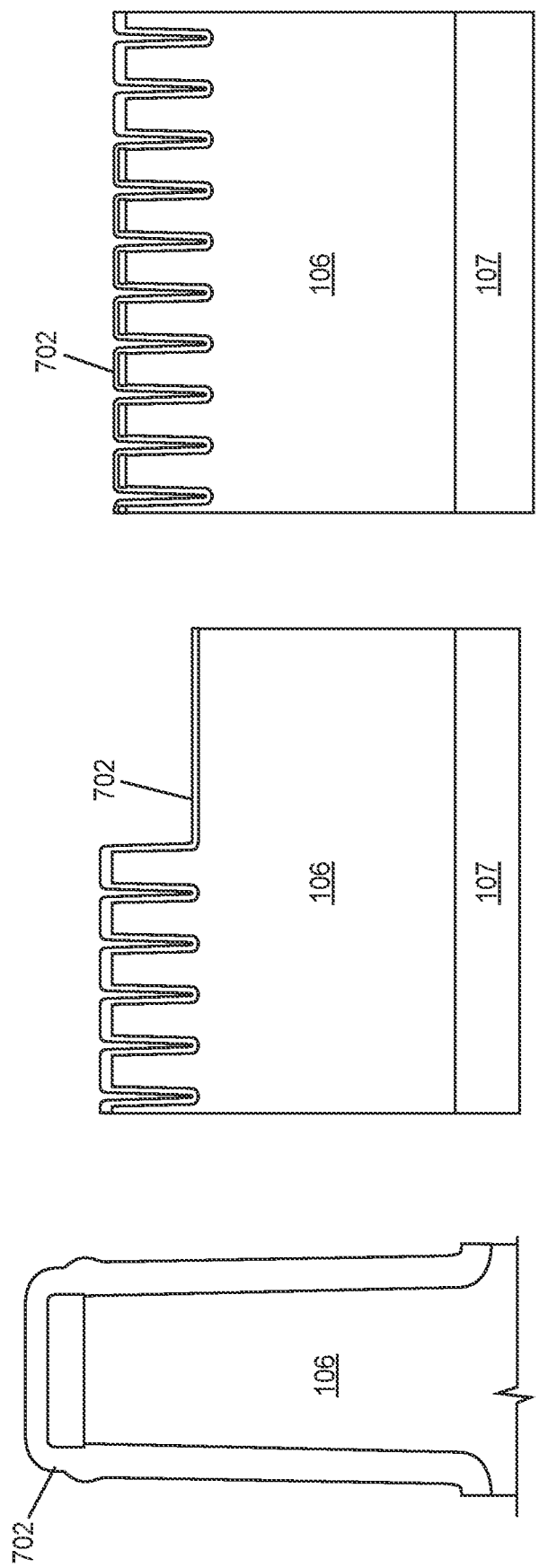

FIG. 7B shows a first dielectric 702 deposited on the sidewalls and bottom of the trenches 100, 304. The first dielectric 702 may be TEOS (tetraethyl orthosilicate) or a thermal oxide, for example.

Figure 7C:
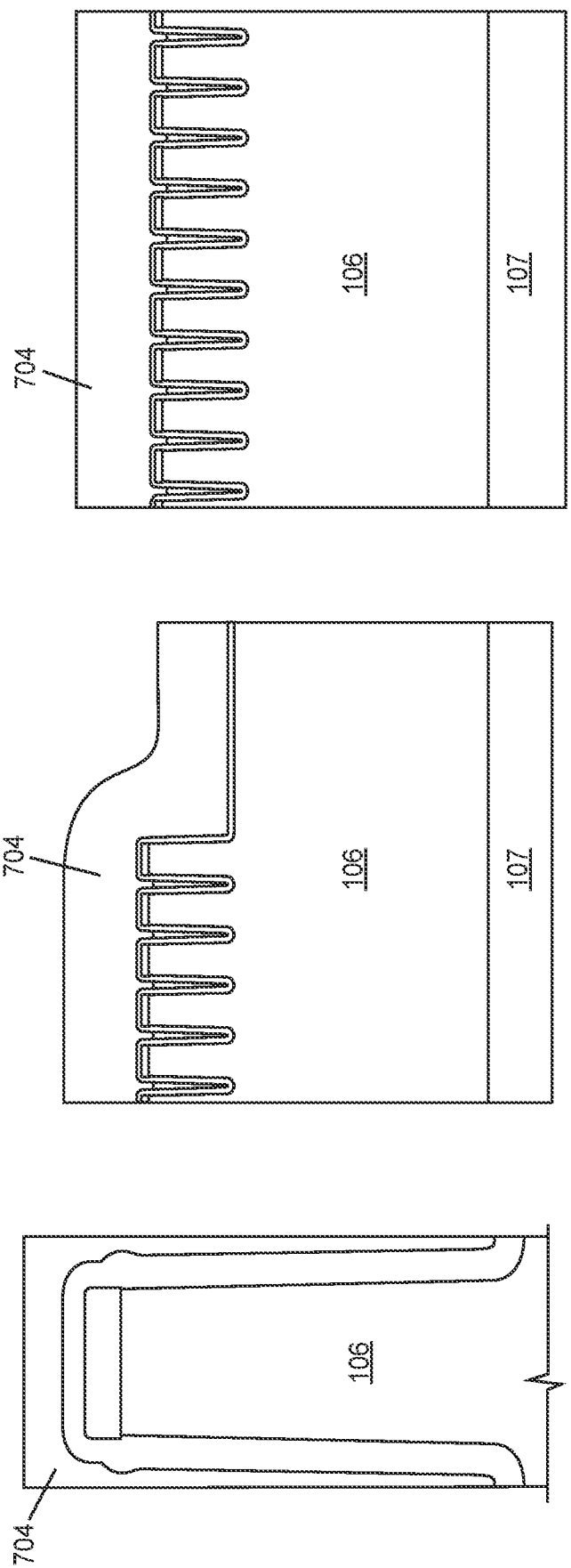

FIG. 7C shows an electrically conductive material 704 filling the trenches 100, 304 and separated from the surrounding semiconductor substrate 104 by the first dielectric 702. In one embodiment, the electrically conductive material 704 is deposited polysilicon.

FIG. 7D shows the electrically conductive material 704 after being planarized to form the basic structure of the field electrodes 108. In one embodiment, the electrically conductive material 704 is planarized by a CMP (chemical-mechanical polishing) process which stops on the first dielectric 702.

FIG. 7E shows a mask 706 formed on part of the device and used to selectively thin the electrically conductive material 704 in the active area 202 of the device while protecting the field electrode material 704 at the first main surface 102 of the substrate 104 in the electrode connection/bus region 204 of the device and in part of the edge termination region 300. The mask 706 protects a part of the electrically conductive material 704 which corresponds to the second section 118 of the field electrodes 108. The part of the electrically conductive material 704 unprotected by the mask 706 is thinned to define the first section 116 of the field electrodes 108. The mask 706 corresponds to the first lithographic layer previously described herein, and also protects the first dielectric material 702 which surrounds the second section 118 of the field electrodes 108 in the electrode connection/bus region 204 of the device during thinning of the field electrode material 704 in the active area 202 of the device. In one embodiment, the mask 706 is a photoresist used to cover the areas where the second section 118 of the field electrodes 108 are to be defined.

FIG. 7F shows the first dielectric 702 removed from the upper part of the sidewalls 708 of the trenches 100 which are fully active/conducting trenches. The first mask 706 may be used to remove the first dielectric 702 from the upper part of the trench sidewalls 708, and is then removed.

Figure 7G:
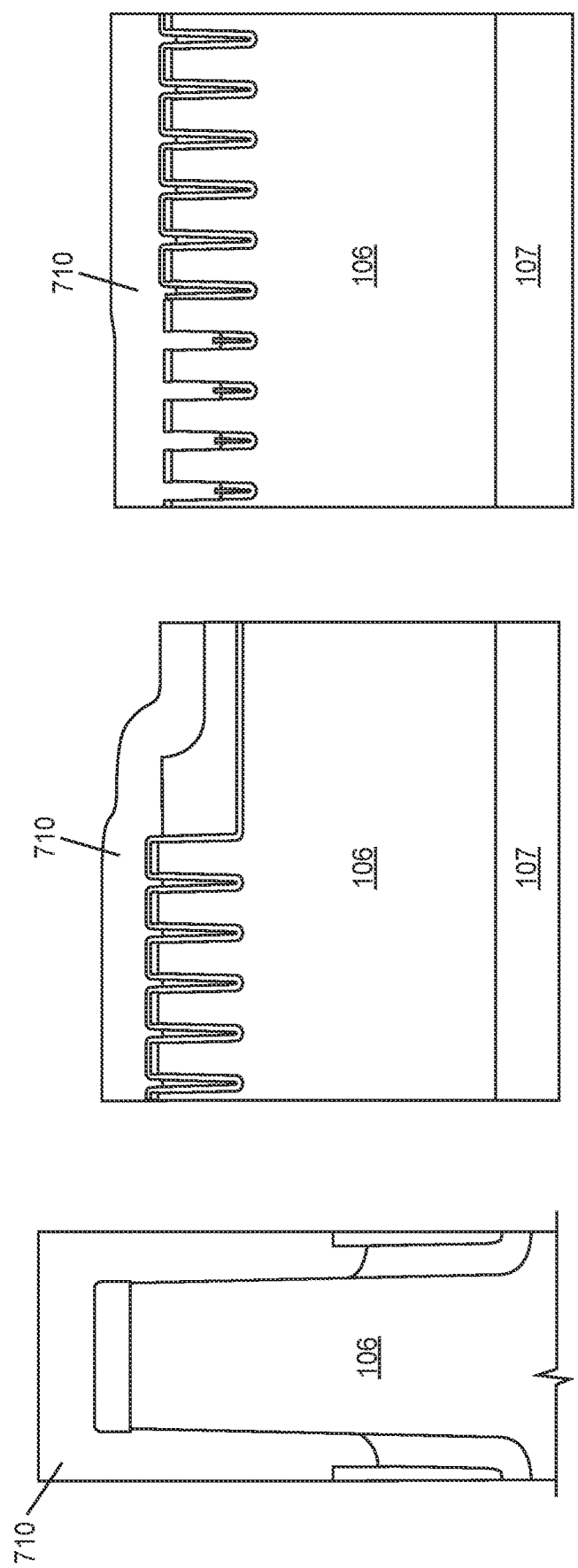

FIG. 7G shows a second dielectric 710 deposited in the trenches 100, 304. In one embodiment, the second dielectric 710 is a high-density plasma (HDP) oxide deposited by chemical vapor deposition (CVD).

FIG. 7H shows the second dielectric 710 after being planarized, e.g., using CMP, to form an inter-electrode dielectric 712 at least in the fully active/conducting trenches 100. The planarization process may stop on the mask 700 used to etch the trenches 100, 304, if still present, and the mask 700 is then removed.

FIG. 7I shows a mask 714 formed on part of the device and used to protect a part of the second dielectric 712 adjoining the second section 118 of the field electrodes 108. The unprotected part of the second dielectric 712 is thinned to form a space 716 in the upper part of at least the fully active/conducting trenches 100 for the gate electrode and to again expose the upper part of the sidewalls 708 of at least the fully active/conducting trenches 100. In the case of the HDP oxide example given above, any typical oxide etching process may be used. The mask 714 used to define the space 716 for the gate electrode in the upper part of at least the fully active/conducting trenches 100 corresponds to the second lithographic layer previously described herein and has an overhang with respect to the mask 706 used in FIG. 7E to thin an unprotected part of the electrically conductive material 704 to define the first section 116 of the field electrodes 108.

As explained previously herein, the extent or degree by which the second mask 714 overhangs the first mask 706 defines the amount of lateral separation 'S1' between the second section 118 of each field electrode 108 and the gate electrode to be formed in the same trench 100. That is, the overhang between the two masks 714, 706 defines the lateral thickness of the second dielectric 710 between the second section 118 of each field electrode 108 and the gate electrode to be formed in the same trench 100.

The thinning of the exposed part of the second dielectric 710 may stop before reaching the buried first section 116 of the field electrodes 108, e.g., as previously described herein in connection with FIG. 5D. Alternatively, the exposed part of the second dielectric 710 may be etched so that the first section 116 of each field electrode 108 is exposed, e.g., as previously described herein in connection with FIG. 6D. In this case, a new inter-electrode dielectric may be formed on the exposed part of the first section 116 of each field electrode 108 as previously described herein, e.g., as previously described herein in connection with FIG. 6E.

FIG. 7J shows a gate dielectric 718 formed on the exposed upper part of the sidewalls 708 of at least the fully active/conducting trenches 100. In one embodiment, the gate dielectric 718 is an oxide formed.

FIG. 7K shows an electrically conductive material 720 such as polysilicon and/or metal deposited in the space 716 previously formed in the upper part of at least the fully active/conducting trenches 100.

FIG. 7L shows the device after the electrically conductive material 720 is planarized, e.g., by CMP. In one embodiment, the planarization process stops on the underlying gate dielectric.

The planarized electrically conductive material 720 forms the gate electrode 112 in the upper part of at least the fully active/conducting trenches 100. The gate dielectric 718 separates the gate electrode 112 in each trench 100 from the surrounding semiconductor substrate 104. As previously explained herein, the lateral separation 'S1' between the second section 118 of the field electrode 108 and the gate electrode 112 in the same trench 100 is greater than or equal to the vertical separation 'S2' between the first section 116 of the field electrode 108 and the gate electrode 112 to ensure robust dielectric breakdown characteristics at the point of electrical connection. Also as previously explained herein, the widths of the masks 714, 706 shown in FIGS. 7E and 7I determines the degree to which the lateral separation 'S1' between the second section 118 of the field electrode 108 and the gate electrode 112 in the same trench 100 is greater than or equal to the vertical separation 'S2' between the first section 116 of the field electrode 108 and the gate electrode 112.

Figure 7M:
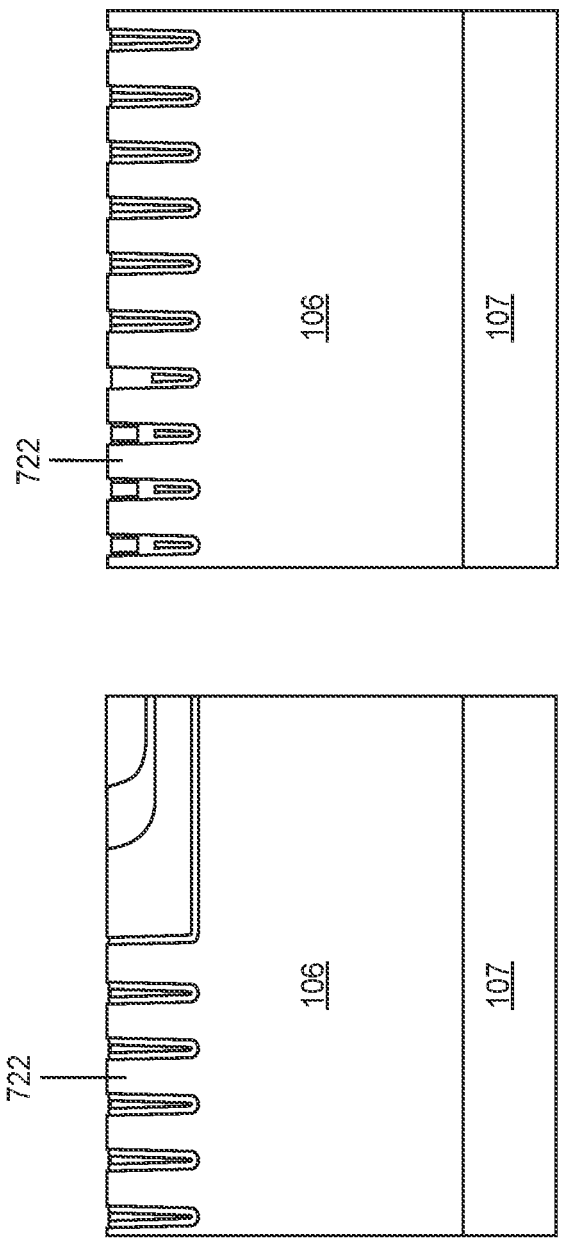

FIG. 7M shows the device after the gate dielectric 718 is removed from the semiconductor mesas 722 between adjacent trenches 100, 304. In the active area 202 of the device, the body and source regions are subsequently formed in the semiconductor mesas 722.

FIG. 7N shows the device after a screen dielectric 724 such as oxide is formed on the surface of the device.

FIG. 7O shows the device after dopants of the second conductivity type are implanted through the screen dielectric 724 into the semiconductor mesas 722 between at least the fully active/conducting trenches 100 and annealed to form the body regions 726 of the device. The body regions 726 include a channel which runs along the trench sidewall 708 between the drift region 106 and the source region to be formed, and is controlled by a voltage applied to the adjacent gate electrode 112.

FIG. 7P shows the device after dopants of the first conductivity type are implanted through the screen dielectric 724 into the body regions 726, and after an interlayer dielectric 728 is formed on the surface of the device. The source regions are not shown in FIG. 7P, because the implanted dopants of the first conductivity type have not been activated yet.

FIG. 7Q shows the device after contact openings 730 are formed in the interlayer dielectric 728 which expose the body regions 726 and the second section 118 of the field electrodes 108. The contact openings 730 may be realized by forming a mask (not shown) with corresponding openings on the interlayer dielectric 728, and etching the exposed parts of the interlayer dielectric 728.

FIG. 7R shows the device after dopants of the second conductivity type are implanted through the contact openings 730 in the interlayer dielectric 728 into the body regions 726, and after an annealing process which activates both dopant types to form highly doped body contact regions 732 of the second conductivity type and source regions 734 of the first conductivity type, respectively. Each body region 726 of the second conductivity type adjoins an adjacent trench 100. Each source region 734 of the first conductivity type also adjoins an adjacent trench 100 above the corresponding body region 726. The drift region 106 of the first conductivity type adjoins the trenches 100 below the body regions 726. The semiconductor substrate 104 may have a base doping concentration which yields the drift region 106. For example, as previously explained herein, the drift region 106 may be an epitaxial region grown on the semiconductor substrate 104 before the trenches 100 are formed.

FIG. 7S shows the device after a source metallization 738 is formed on the interlayer dielectric 728 and filling the contact openings 730 in the interlayer dielectric 728. The source metallization 738 provide source potential to the source and body regions, 734, 726, and to the field electrodes 108 via the second section 118 in this embodiment. The field electrodes 108 may instead be coupled to a different potential such as the gate metallization which is out of view in FIG. 7S.

As mentioned above, the rightmost drawing of each of FIGS. 7A through 7S is a cross-section through the edge termination region of the device. From left to right in the rightmost drawing of each of FIGS. 7A through 7S: the first trench is a fully active/conducting trench; the second trench is an active/conducting on the left-hand side; the third and fourth trenches are non-conducting in the on-state of the device; and the fifth trench and onward are electric field termination trenches. The electric field termination trenches, some of which have floating field electrodes, may be used for termination, especially for higher voltage devices, with the voltage gradually being dropped in the semiconductor mesas between these trenches. The electric field termination trenches may also serve to ensure pattern density requirements are met in the trench layer, such that the first active trench from the edge has a critical dimension which is on target.

Figure 8:
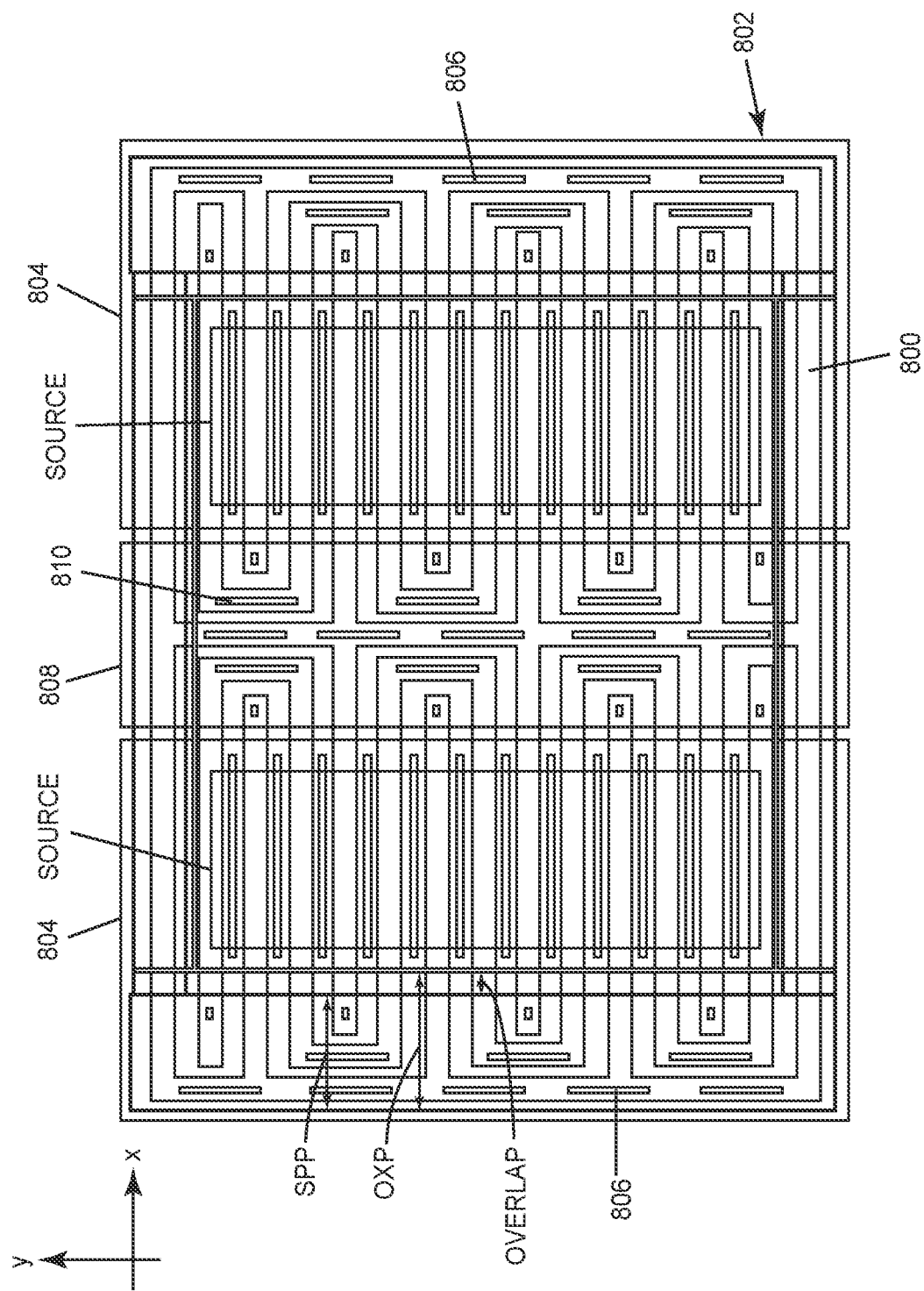
FIG. 8 illustrates a top plan view of a semiconductor device having a trench field electrode termination structure, according to another embodiment.

FIG. 8 illustrates a top plan view of another embodiment of a semiconductor device having a trench field electrode termination structure which enables easy electrical connection to the field electrode with robust dielectric breakdown characteristics at the point of electrical connection. According to this embodiment, the semiconductor device includes trenches 100 formed in a first main surface of a semiconductor substrate 802, the trenches 800 extending lengthwise in a direction 'x' parallel to the first main surface. A field electrode is formed in the lower part of the trenches 800 and separated from the semiconductor substrate 802 by a dielectric. A gate electrode is formed in an upper part of the trenches 800 and separated from the semiconductor substrate 802 and the field electrode so that a first section of the field electrode is buried below the gate electrode in the trenches 800, a second section of the field electrode transitions upward from the first section in a direction toward the first main surface in an intermediate part of the trenches between opposing ends of the trenches, and the separation between the second section of the field electrode and the gate electrode is greater than or equal to the separation between the first section of the field electrode and the gate electrode.

Body regions of a second conductivity type adjoin the trenches 800, source regions of a first conductivity type also adjoin the trenches 800 above the body regions, and a drift region of the first conductivity type adjoins the trenches 800 below the body regions. A simplified representation of the trenches 800 and device regions is shown in FIG. 8, to emphasize the serpentine-like layout of the trenches 800. The field and gate electrodes may be disposed in the trenches 800 as shown in any one of the preceding figures, and the device regions may also be arranged as previously described herein and illustrated. The source implantation region is represented by the boxes labelled 'Source' in FIG. 8.

An electrically conductive layer formed above the trenches 800 is electrically connected to the field electrode in the trenches 800 at the second section and has a lengthwise extension in direction 'y' which is transverse to the lengthwise extension of the trenches in direction 'x'. For example, the second section of the field electrodes disposed in the trenches 800 may be contacted at the ends of the trenches 800 to a source metallization 804 by contacts 806 which extend through an interlayer dielectric separating the source metallization 804 from the underlying substrate 802. The gate electrodes disposed in the trenches 800 may be contacted in an intermediate region 800 to a gate metallization 808 by contacts 810 which extend through the interlayer dielectric. The masks/lithographic layers which define the amount of separation between the second section of the field electrode and the gate electrode in each trench 800 are labelled 'SPP' and 'OXP' in FIG. 8, with the overhang between the masks/lithographic layers being labelled 'Overlap'.

After forming the gate electrode in the upper part of the trenches 800 but before forming the source and gate metallizations 804, 808 above the trenches 800, an interlayer dielectric may be formed over the semiconductor substrate 802, e.g., as shown in FIG. 7P. Using a common lithography process, contact openings may be formed which extend through the interlayer dielectric to the source regions, the body regions, the gate electrodes, the second section of the field electrodes and to field termination structures formed in an edge termination region of the semiconductor substrate 802. According to this embodiment, all device contacts have the identical critical dimension and depth, making it easier for all device contacts to be implemented using a single lithography step, e.g., as shown in FIG. 7Q.

Although the present disclosure is not so limited, the following numbered examples demonstrate one or more aspects of the disclosure.

Example 1. A semiconductor device, comprising: a trench formed in a first main surface of a semiconductor substrate and extending lengthwise in a direction parallel to the first main surface; a body region of a second conductivity type adjoining the trench; a source region of a first conductivity type adjoining the trench above the body region; a drift region of the first conductivity type adjoining the trench below the body region; a field electrode disposed in a lower part of the trench and separated from the semiconductor substrate; and a gate electrode disposed in an upper part of the trench and separated from the semiconductor substrate and the field electrode, wherein a first section of the field electrode is buried below the gate electrode in the trench, wherein a second section of the field electrode transitions upward from the first section in a direction toward the first main surface, wherein the separation between the second section of the field electrode and the gate electrode is greater than or equal to the separation between the first section of the field electrode and the gate electrode.

Example 2. The semiconductor device of example 1, wherein the separation between the second section of the field electrode and the gate electrode is greater than the separation between the first section of the field electrode and the gate electrode.

Example 3. The semiconductor device of examples 1 or 2, wherein a same type of dielectric material separates the first and the second sections of the field electrode from the gate electrode.

Example 4. The semiconductor device of any one of examples 1 through 3, wherein the second section of the field electrode transitions upward from the first section in an intermediate part of the trench between opposing ends of the trench, and wherein an electrically conductive layer formed above the trench and which is electrically connected to the field electrode at the second section has a lengthwise extension which is transverse to the lengthwise extension of the trench.

Example 5. The semiconductor device of any one of examples 1 through 3, wherein the second section of the field electrode transitions upward from the first section at an end of the trench which is adjacent an edge termination region formed in the semiconductor substrate.

Example 6. A method of producing a semiconductor device, the method comprising: forming a trench in a first main surface of a semiconductor substrate, the trench extending lengthwise in a direction parallel to the first main surface; forming a field electrode in a lower part of the trench and separated from the semiconductor substrate; forming a gate electrode in an upper part of the trench and separated from the semiconductor substrate and the field electrode so that a first section of the field electrode is buried below the gate electrode in the trench, a second section of the field electrode transitions upward from the first section in a direction toward the first main surface, and the separation between the second section of the field electrode and the gate electrode is greater than or equal to the separation between the first section of the field electrode and the gate electrode; forming a body region of a second conductivity type adjoining the trench; forming a source region of a first conductivity type adjoining the trench above the body region; and forming a drift region of the first conductivity type adjoining the trench below the body region. As previously explained herein, the drift region may be an epitaxial region grown on the semiconductor substrate, e.g., before the trench is formed.

Example 7. The method of example 6, wherein forming the field electrode comprises: lining a bottom and sidewalls of the trench with a first dielectric; after lining the bottom and the sidewalls of the trench with the first dielectric, filling the trench with an electrically conductive material; thinning part of the electrically conductive material to form the first and the second sections of the field electrode; filling a space in the trench formed by thinning the electrically conductive material with a second dielectric; thinning the second dielectric over the first section of the field electrode so that a lateral thickness of the second dielectric measured in a horizontal direction toward the second section of the field electrode is greater than or equal to a vertical thickness of the second dielectric measured in a vertical direction toward the first section of the field electrode; and forming the gate electrode in a space formed in the trench after the second dielectric is thinned over the first section of the field electrode.

Example 8. The method of example 7, wherein thinning part of the electrically conductive material to form the first and the second sections of the field electrode comprises: forming a first mask which protects a portion of the electrically conductive material; and thinning the part of the electrically conductive material unprotected by the first mask.

Example 9. The method of example 8, wherein thinning the second dielectric over the first section of the field electrode comprises: forming a second mask which protects a part of the second dielectric adjoining the portion of the electrically conductive material which was protected by the first mask during the thinning of the electrically conductive material; and thinning the part of the second dielectric unprotected by the second mask, wherein an overhang between the second mask and the first mask defines the amount of separation between the second section of the field electrode and the gate electrode.

Example 10. The method of example 9, further comprising: after thinning the part of the second dielectric unprotected by the second mask but before forming the gate electrode, forming a gate dielectric along an upper part of the sidewalls of the trench.

Example 11. The method of example 6, wherein forming the field electrode comprises: lining a bottom and sidewalls of the trench with a first dielectric; after lining the bottom and the sidewalls of the trench with the first dielectric, filling the trench with an electrically conductive material; thinning part of the electrically conductive material to form the first and the second sections of the field electrode; filling a space in the trench formed by thinning the electrically conductive material with a second dielectric; etching the second dielectric so that the first section of the field electrode is exposed and the second dielectric remains only along sidewalls of the second section of the field electrode; forming a third dielectric on the exposed part of the first section of the field electrode and on the remaining part of the second dielectric, so that a combined lateral thickness of the third dielectric and the remaining part of the second dielectric measured in a horizontal direction toward the second section of the field electrode is greater than or equal to a vertical thickness of the third dielectric measured in a vertical direction toward the first section of the field electrode; and forming the gate electrode in a space formed in the trench after depositing the third dielectric.

Example 12. The method of example 11, wherein thinning part of the electrically conductive material to form the first and the second sections of the field electrode comprises: forming a first mask which protects a portion of the electrically conductive material; and thinning the part of the electrically conductive material unprotected by the first mask.

Example 13. The method of example 12, wherein etching the second dielectric comprises: forming a second mask which protects a part of the second dielectric adjoining the portion of the electrically conductive material which was protected by the first mask during the thinning of the electrically conductive material; and etching a part of the second dielectric unprotected by the second mask down to the first section of the field electrode to expose the first section, wherein an overhang between the second mask and the first mask defines the amount of separation between the second section of the field electrode and the gate electrode.

Example 14. The method of example 13, further comprising: after exposing the first section of the field electrode and after depositing the third dielectric but before forming the gate electrode, forming a gate dielectric along an upper part of the sidewalls of the trench.

Example 15. The method of any one of examples 11 through 14, wherein the third dielectric is deposited by high density plasma chemical vapor deposition.

Example 16. The method of any one of examples 11 through 14, wherein the third dielectric is formed as part of a gate oxidation process during which an accelerated oxidation rate of heavily phosphorus-doped polysilicon forms the third dielectric.

Example 17. The method of example 6, further comprising: forming an edge termination region in the semiconductor substrate, wherein a first end of the trench terminates adjacent the edge termination region, wherein the second section of the field electrode transitions upward from the first section at the first end of the trench, wherein forming the field electrode comprises: lining a bottom and sidewalls of the trench with a first dielectric; after lining the bottom and the sidewalls of the trench with the first dielectric, filling the trench with an electrically conductive material; thinning part of the electrically conductive material spaced apart from the first end of the trench to form the first and the second sections of the field electrode, the first section being disposed in the first end of the trench; filling a space in the trench formed by thinning the electrically conductive material with a second dielectric; thinning the second dielectric over the first section of the field electrode so that a lateral thickness of the second dielectric measured in a horizontal direction toward the second section of the field electrode is greater than or equal to a vertical thickness of the second dielectric measured in a vertical direction toward the first section of the field electrode; and forming the gate electrode in a space formed in the trench after the second dielectric is thinned over the first section of the field electrode.

Example 18. The method of example 17, wherein thinning part of the electrically conductive material spaced apart from the first end of the trench comprises: forming a first mask which protects the part of the electrically conductive material disposed in the first end of the trench; and thinning the part of the electrically conductive material spaced apart from the first end of the trench and unprotected by the first mask.

Example 19. The method of example 18, wherein thinning the second dielectric over the first section of the field electrode comprises: forming a second mask which protects a part of the second dielectric adjoining the part of the electrically conductive material disposed in the first end of the trench and which was protected by the first mask during the thinning of the electrically conductive material; and thinning the part of the second dielectric spaced apart from the first end of the trench and unprotected by the second mask, wherein an overhang between the second mask and the first mask defines the amount of separation between the second section of the field electrode and the gate electrode.

Example 20. The method of example 6, wherein gate oxidation forms both the gate oxide and the dielectric between the first section of the field electrode and the gate electrode.

Example 21. A method of producing a semiconductor device, the method comprising: forming trenches in a first main surface of a semiconductor substrate, the trenches extending lengthwise in a direction parallel to the first main surface; forming a field electrode in a lower part of the trenches and separated from the semiconductor substrate; forming a gate electrode in an upper part of the trenches and separated from the semiconductor substrate and the field electrode so that a first section of the field electrode is buried below the gate electrode in the trenches, a second section of the field electrode transitions upward from the first section in a direction toward the first main surface in an intermediate part of the trenches between opposing ends of the trenches, and the separation between the second section of the field electrode and the gate electrode is greater than or equal to the separation between the first section of the field electrode and the gate electrode; forming body regions of a second conductivity type adjoining the trenches; forming source regions of a first conductivity type adjoining the trenches above the body regions; forming a drift region of the first conductivity type adjoining the trenches below the body regions; and forming an electrically conductive layer above the trenches and which is electrically connected to the field electrode in the trenches at the second section and has a lengthwise extension which is transverse to the lengthwise extension of the trenches. As previously explained previously herein, the drift region may be an epitaxial region grown on the semiconductor substrate, e.g., before the trenches are formed.

Example 22. The method of example 21, further comprising: after forming the gate electrode in the upper part of the trenches but before forming the electrically conductive layer above the trenches, forming an interlayer dielectric over the semiconductor substrate; and forming, using a common lithography process, contact openings which extend through the interlayer dielectric to the source regions, the body regions, the gate electrodes, the second section of the field electrodes and to field termination structures formed in an edge termination region of the semiconductor substrate.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench formed in a first main surface of a semiconductor substrate and extending lengthwise in a direction parallel to the first main surface;
   a body region of a second conductivity type adjoining the trench;
   a source region of a first conductivity type adjoining the trench above the body region;
   a drift region of the first conductivity type adjoining the trench below the body region;
   a field electrode disposed in a lower part of the trench and separated from the semiconductor substrate; and
   a gate electrode disposed in an upper part of the trench and separated from the semiconductor substrate and the field electrode,
   wherein a first section of the field electrode is buried below the gate electrode in the trench, wherein a second section of the field electrode transitions upward from the first section in a direction toward the first main surface, wherein the separation between the second section of the field electrode and the gate electrode is greater than the separation between the first section of the field electrode and the gate electrode, wherein the second section of the field electrode transitions upward from the first section in an intermediate part of the trench between opposing ends of the gate electrode.

2. The semiconductor device of claim 1, wherein a same type of dielectric material separates the first and the second sections of the field electrode from the gate electrode.

3. The semiconductor device of claim 1, further comprising an electrically conductive layer formed above the trench and which is electrically connected to the field electrode at the second section has a lengthwise extension which is transverse to the lengthwise extension of the trench.

4. A method of producing a semiconductor device, the method comprising:
   forming a trench in a first main surface of a semiconductor substrate, the trench extending lengthwise in a direction parallel to the first main surface;
   forming a field electrode in a lower part of the trench and separated from the semiconductor substrate;
   forming a gate electrode in an upper part of the trench and separated from the semiconductor substrate and the field electrode so that a first section of the field electrode is buried below the gate electrode in the trench, a second section of the field electrode transitions upward from the first section in a direction toward the first main surface, and the separation between the second section of the field electrode and the gate electrode is greater than or equal to the separation between the first section of the field electrode and the gate electrode;
   forming a body region of a second conductivity type adjoining the trench;
   forming a source region of a first conductivity type adjoining the trench above the body region; and
   forming a drift region of the first conductivity type adjoining the trench below the body region,
   wherein forming the field electrode comprises:
      lining a bottom and sidewalls of the trench with a first dielectric;
      after lining the bottom and the sidewalls of the trench with the first dielectric, filling the trench with an electrically conductive material;
      thinning part of the electrically conductive material to form the first and the second sections of the field electrode, such that the second section of the field electrode transitions upward from the first section in an intermediate part of the trench;
      filling a space in the trench formed by thinning the electrically conductive material with a second dielectric;
      thinning the second dielectric over the first section of the field electrode so that a lateral thickness of the second dielectric measured in a horizontal direction toward the second section of the field electrode is greater than or equal to a vertical thickness of the second dielectric measured in a vertical direction toward the first section of the field electrode; and
      forming the gate electrode in a space formed in the trench after the second dielectric is thinned over the first section of the field electrode, such that the intermediate part of the trench where the second section of the field electrode transitions upward from the first section is between opposing ends of the gate electrode.

5. The method of claim 4, wherein thinning part of the electrically conductive material to form the first and the second sections of the field electrode comprises:
   forming a first mask which protects a portion of the electrically conductive material; and
   thinning the part of the electrically conductive material unprotected by the first mask.

6. The method of claim 5, wherein thinning the second dielectric over the first section of the field electrode comprises:
   forming a second mask which protects a part of the second dielectric adjoining the portion of the electrically conductive material which was protected by the first mask during the thinning of the electrically conductive material; and
   thinning the part of the second dielectric unprotected by the second mask,
   wherein an overhang between the second mask and the first mask defines the amount of separation between the second section of the field electrode and the gate electrode.

7. The method of claim 6, further comprising:
   after thinning the part of the second dielectric unprotected by the second mask but before forming the gate electrode, forming a gate dielectric along an upper part of the sidewalls of the trench.

8. A method of producing a semiconductor device, the method comprising:
   forming trenches in a first main surface of a semiconductor substrate, the trenches extending lengthwise in a direction parallel to the first main surface;
   forming a field electrode in a lower part of the trenches and separated from the semiconductor substrate;
   forming a gate electrode in an upper part of the trenches and separated from the semiconductor substrate and the field electrode so that a first section of the field electrode is buried below the gate electrode in the trenches, a second section of the field electrode transitions upward from the first section in a direction toward the first main surface in an intermediate part of the trenches between opposing ends of the gate electrode, and the separation between the second section of the field electrode and the gate electrode is greater than or equal to the separation between the first section of the field electrode and the gate electrode;
   forming body regions of a second conductivity type adjoining the trenches;
   forming source regions of a first conductivity type adjoining the trenches above the body regions;
   forming a drift region of the first conductivity type adjoining the trenches below the body regions; and
   forming an electrically conductive layer above the trenches and which is electrically connected to the field electrode in the trenches at the second section and has a lengthwise extension which is transverse to the lengthwise extension of the trenches.

9. The method of claim 8, further comprising:
   after forming the gate electrode in the upper part of the trenches but before forming the electrically conductive layer above the trenches, forming an interlayer dielectric over the semiconductor substrate; and
   forming, using a common lithography process, contact openings which extend through the interlayer dielectric to the source regions, the body regions, the gate electrodes, the second section of the field electrodes and to field termination structures formed in an edge termination region of the semiconductor substrate.

10. A semiconductor device, comprising:
a trench formed in a first main surface of a semiconductor substrate and extending lengthwise in a direction parallel to the first main surface;
a body region of a second conductivity type adjoining the trench;
a source region of a first conductivity type adjoining the trench above the body region;
a drift region of the first conductivity type adjoining the trench below the body region;
a field electrode disposed in a lower part of the trench and separated from the semiconductor substrate; and
a gate electrode disposed in an upper part of the trench and separated from the semiconductor substrate and the field electrode,
wherein a first section of the field electrode is buried below the gate electrode in the trench,
wherein a second section of the field electrode transitions upward from the first section in a direction toward the first main surface,
wherein the separation between the second section of the field electrode and the gate electrode is greater than or equal to the separation between the first section of the field electrode and the gate electrode,
wherein the second section of the field electrode transitions upward from the first section in an intermediate part of the trench between opposing ends of the gate electrode,
wherein an electrically conductive layer formed above the trench and which is electrically connected to the field electrode at the second section has a lengthwise extension which is transverse to the lengthwise extension of the trench.

11. A method of producing a semiconductor device, the method comprising:
forming a trench in a first main surface of a semiconductor substrate, the trench extending lengthwise in a direction parallel to the first main surface;
forming a field electrode in a lower part of the trench and separated from the semiconductor substrate;
forming a gate electrode in an upper part of the trench and separated from the semiconductor substrate and the field electrode so that a first section of the field electrode is buried below the gate electrode in the trench, a second section of the field electrode transitions upward from the first section in a direction toward the first main surface, and the separation between the second section of the field electrode and the gate electrode is greater than or equal to the separation between the first section of the field electrode and the gate electrode;
forming a body region of a second conductivity type adjoining the trench;
forming a source region of a first conductivity type adjoining the trench above the body region; and
forming a drift region of the first conductivity type adjoining the trench below the body region,
wherein forming the field electrode comprises:
lining a bottom and sidewalls of the trench with a first dielectric;
after lining the bottom and the sidewalls of the trench with the first dielectric, filling the trench with an electrically conductive material;
thinning part of the electrically conductive material to form the first and the second sections of the field electrode;
filling a space in the trench formed by thinning the electrically conductive material with a second dielectric;
etching the second dielectric so that the first section of the field electrode is exposed and the second dielectric remains only along sidewalls of the second section of the field electrode;
forming a third dielectric on the exposed part of the first section of the field electrode and on the remaining part of the second dielectric, so that a combined lateral thickness of the third dielectric and the remaining part of the second dielectric measured in a horizontal direction toward the second section of the field electrode is greater than or equal to a vertical thickness of the third dielectric measured in a vertical direction toward the first section of the field electrode; and
forming the gate electrode in a space formed in the trench after depositing the third dielectric.

12. The method of claim 11, wherein thinning part of the electrically conductive material to form the first and the second sections of the field electrode comprises:
forming a first mask which protects a portion of the electrically conductive material; and
thinning the part of the electrically conductive material unprotected by the first mask.

13. The method of claim 12, wherein etching the second dielectric comprises:
forming a second mask which protects a part of the second dielectric adjoining the portion of the electrically conductive material which was protected by the first mask during the thinning of the electrically conductive material; and
etching a part of the second dielectric unprotected by the second mask down to the first section of the field electrode to expose the first section,
wherein an overhang between the second mask and the first mask defines the amount of separation between the second section of the field electrode and the gate electrode.

14. The method of claim 13, further comprising:
after exposing the first section of the field electrode and after depositing the third dielectric but before forming the gate electrode, forming a gate dielectric along an upper part of the sidewalls of the trench.

15. The method of claim 11, wherein the third dielectric is formed by high density plasma chemical vapor deposition.

16. The method of claim 11, wherein the third dielectric is formed as part of a gate oxidation process during which an accelerated oxidation rate of heavily phosphorus-doped polysilicon forms the third dielectric.

* * * * *